US010055531B2

(12) United States Patent
Wang et al.

(10) Patent No.: US 10,055,531 B2
(45) Date of Patent: Aug. 21, 2018

(54) LAYOUT CHECKING METHOD FOR ADVANCED DOUBLE PATTERNING PHOTOLITHOGRAPHY WITH MULTIPLE SPACING CRITERIA

(71) Applicant: TAIWAN SEMICONDUCTOR MANUFACTURING COMPANY LTD., Hsinchu (TW)

(72) Inventors: Chung-Hsing Wang, Hsinchu County (TW); King-Ho Tam, Hsinchu County (TW); Yuan-Te Hou, Hsinchu (TW); Chin-Chang Hsu, Taipei County (TW); Meng-Kai Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 631 days.

(21) Appl. No.: 14/622,009

(22) Filed: Feb. 13, 2015

(65) Prior Publication Data

US 2016/0239599 A1 Aug. 18, 2016

(51) Int. Cl.
*G06F 17/50* (2006.01)
*H01L 27/02* (2006.01)
*H01L 27/11582* (2017.01)

(52) U.S. Cl.
CPC ...... *G06F 17/5081* (2013.01); *H01L 27/0207* (2013.01); *H01L 27/11582* (2013.01)

(58) Field of Classification Search
CPC ..... G06F 17/5081; G03F 1/70; G03F 7/70466
See application file for complete search history.

(56) References Cited

U.S. PATENT DOCUMENTS

2011/0197168 A1\* 8/2011 Chen .................. G06F 17/5081
716/50

OTHER PUBLICATIONS

Ghaida et al., "SPD12: Layout Decomposition and Legalization for Double-Patterning Technology". IEEE Transactions on Computer-Aided Design of Integrated Circuits and Systems, vol. 32, No. 2, pp. 202-215. Feb. 2013.\*

\* cited by examiner

*Primary Examiner* — Vuthe Siek
*Assistant Examiner* — Aric Lin
(74) *Attorney, Agent, or Firm* — WPAT, P.C., Intellectual Property Attorneys; Anthony King

(57) ABSTRACT

In some embodiments, in a method performed by at least one processor, spaces among a plurality of layout segments is analyzed by the at least one processor to determine at least one first-type conflicted edge according to a first predetermined length. Spaces among the plurality of layout segments is analyzed by the at least one processor to determine a plurality of potential conflicted edges according to a second predetermined length different from the first predetermined length. At least one second-type conflicted edge is determined by the at least one processor according to the plurality of potential conflicted edges. If at least one odd-vertex loop is formed in the plurality of layout segments is checked by the at least one processor according to the at least one first-type conflicted edge and the at least one second-type conflicted edge to determine if a violation occurs in the plurality of layout segments.

17 Claims, 25 Drawing Sheets

LAYOUT CHECKING METHOD FOR ADVANCED DOUBLE PATTERNING PHOTOLITHOGRAPHY WITH MULTIPLE SPACING CRITERIA

BACKGROUND

Photolithography is a process to fabricate an integrated circuit after the integrated circuit is designed. In the photolithographic process, a photomask, or more simply a mask, is used to lithograph a mask pattern, which is similar to the physical layout of a layer of an integrated circuit, onto a wafer surface. With the continuing scaling of feature size of chips, the pattern size on a photomask is also reduced. As a result, the non-linear imaging effect happens, i.e. the resolution of a photoresist pattern begins to blur, when the pattern size goes beyond the resolution limit of the photolithographic process. Conventionally, a technology of double patterning is developed for photolithography to enhance the feature density. The double patterning is enhanced to produce twice the expected number of features.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
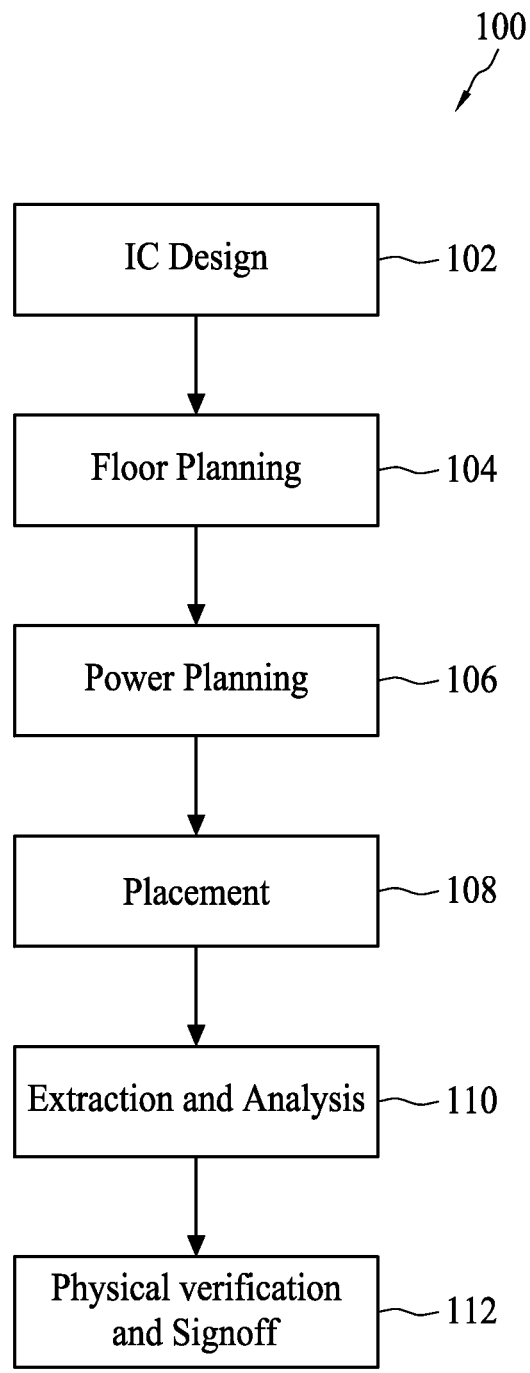
FIG. 1 is a flow chart of a design flow of an IC chip in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a flow chart of a design flow 100 of an IC (Integrated Circuit) chip in accordance with some embodiments. The design flow 100 utilizes one or more electronic design automation (EDA) tools to carry out one or more operations in the design flow 100.

At an IC design stage 102, a high-level design of the IC chip is provided by a circuit designer. In some embodiments, a gate-level netlist is generated through logic synthesis based on the high-level design and gates in the gate-level netlist are mapped to available cells in a standard cell library. The term "netlist" used herein refers to both graphical-based representation such as a schematic and/or a text-based representation of a circuit.

At a floor planning stage 104, the gate-level netlist is partitioned into functional blocks and a floorplan for the functional blocks in a design layout of the IC chip is created.

At a power planning stage 106, power meshes such as a VDD power (e.g. the supply voltage) mesh and a VSS power (e.g. the ground voltage) mesh are routed. The power mesh includes several metal layers. Each metal layer includes power lines or power rails running, for example, horizontally or vertically. The metal layers are stacked such that any adjacent metal layers have the power lines or power rails running in, for example, orthogonal directions.

At a placement stage 108, mapped cells of logic gates and registers in the blocks are placed at specific locations in the design layout.

At a parasitic extraction and analysis stage 110, the design layout, which includes the routing, is analyzed to extract the parasitics in the design layout and accordingly generate a physical netlist.

At a physical verification and signoff stage 112, layout-versus-schematic (LVS) is performed on a physical netlist generated from the design layout to ensure correspondence of the design layout to the gate-level netlist. Further, design rule check (DRC) is performed on the design layout to ensure the design clean of, for example, electrical issues and lithographic issues for manufacturing. Incremental fixing can be performed to achieve final signoff of the IC chip design before tape-out.

In the process of fabricating an integrated circuit, the double patterning technology may overcome the distortion or deviation on the geometric physical layout when the layout is lithographed by a single mask having high density of patterns. Generally speaking, the double patterning technology includes a process of sequentially using two different masks, which have different patterns formed thereon, to photolithograph their different features on a layer of the substrate respectively. Therefore, the double patterning technology may produce twice the expected number of features in comparison to the single patterning technology. However, the distribution of the layout shapes on a layer may also need to conform to the design rule of double patterning photolithography in order to properly decompose the layout shapes on a layer into two masks.

Figure 2:
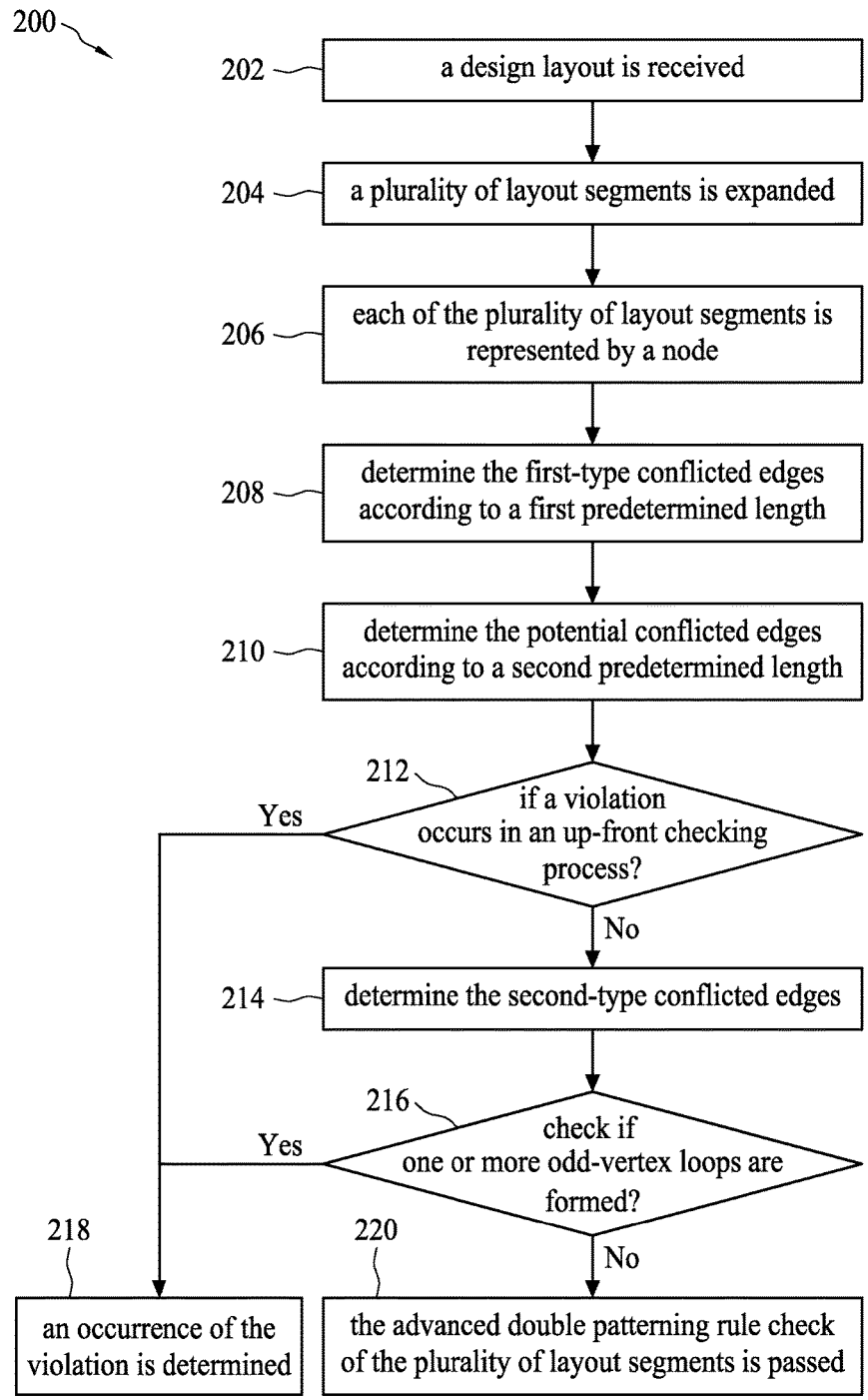
FIG. 2 is a flow diagram illustrating a layout checking method in accordance with some embodiments.

FIG. 2 is a flow diagram illustrating a layout checking method 200 in accordance with some embodiments. The layout checking method 200 may be applied to check if the distribution of the design layout of an integrated circuit (IC) conforms to the criteria of advanced double patterning photolithography. In some embodiments, the layout checking method 200 is performed during the physical verification and signoff stage 112. In operation 202, a design layout of an integrated circuit is received. In operation 204, a plurality of layout segments or layout shapes in a layer of the design layout is expanded and/or displayed. In operation 206, each of the plurality of layout segments is represented by a node. In operation 208, spaces among the plurality of layout segments in the layer of the integrated circuit are analyzed to determine one or more first-type conflicted edges according to a first predetermined length. In operation 210, spaces among the plurality of layout segments in the layer of the integrated circuit are analyzed to determine one or more potential conflicted edges according to a second predetermined length. In operation 212, it is determined if violation occurs in the plurality of layout segments in an up-front checking process. If not, the method continues to operation 214. If so, the method goes to operation 218. In operation 214, the one or more potential conflicted edges are analyzed to determine one or more second-type conflicted edges. In operation 216, the one or more first-type conflicted edges and the one or more second-type conflicted edges are analyzed to check if one or more odd-vertex loops are formed in the plurality of layout segments. If not, the method continues to operation 220. If so, the method goes to operation 218. In operation 218, an occurrence of the violation is determined in the plurality of layout segments. In operation 220, no violation occurs in the plurality of layout segments and the advanced double patterning rule check of the plurality of layout segments is passed.

Figure 3:
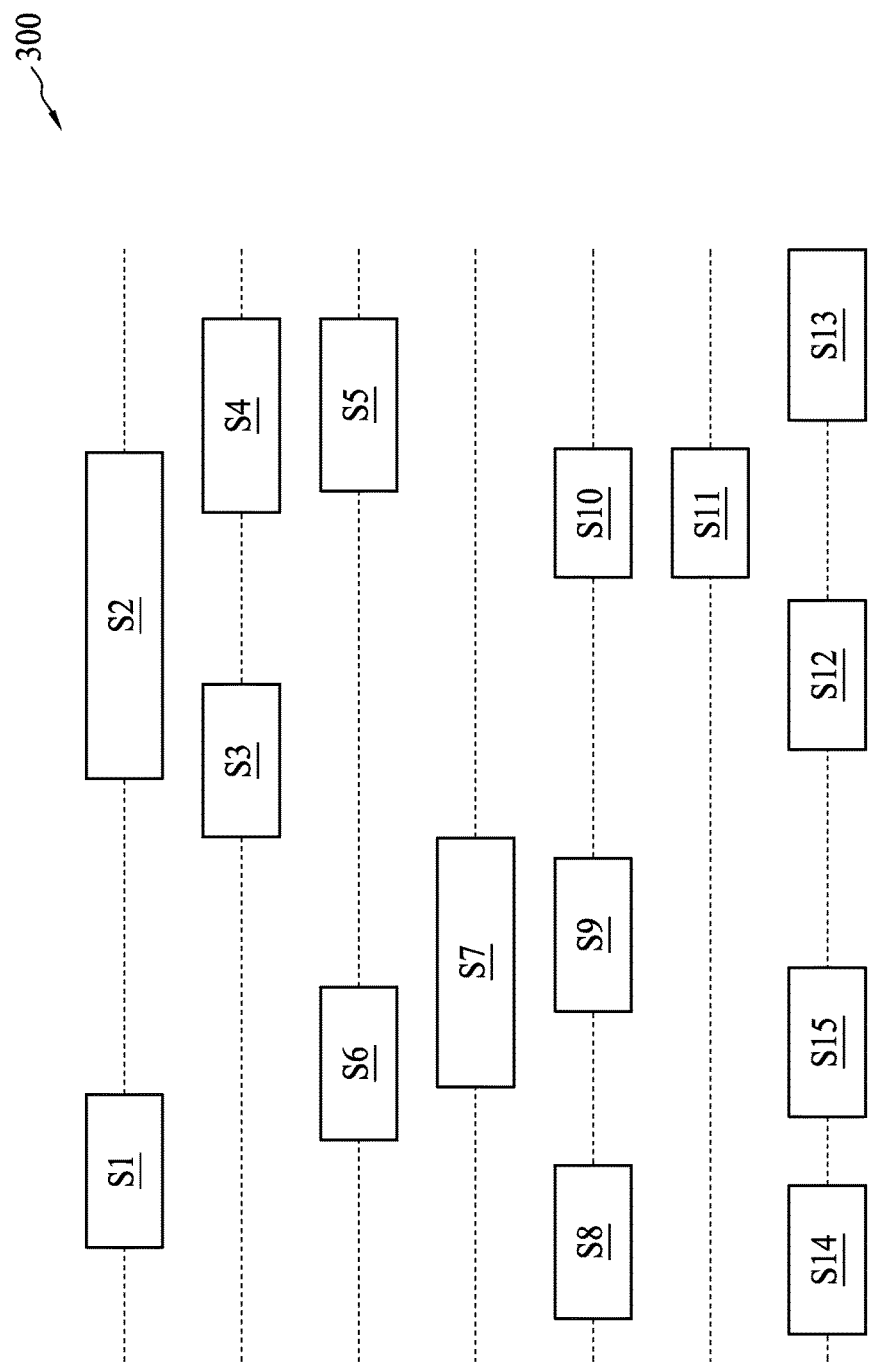
FIG. 3 is a schematic diagram of a received layout on a particular layer of an integrated circuit in accordance with some embodiments.

In operation 204, the plurality of layout segments in a particular layer of the design layout is expanded and/or displayed to various output devices such as a printer, a screen, a graphic display device, or the like. Each of the plurality of layout segments may be regarded as a pattern to be formed on the particular layer of the integrated circuit, and the pattern may comprise one or more runs, ends, corners, and/or any other shapes of layout. FIG. 3 is a schematic diagram of a received layout 300 on a particular layer of an integrated circuit in accordance with some embodiments. For illustration purpose, the layout 300 may be a portion of layout on the particular layer of the integrated circuit. The layout 300 comprises a plurality of layout segments S1~S15. When the integrated circuit is fabricated under a semiconductor fabrication process, the spatial relationships among the plurality of layout segments S1~S15 should observe the advanced double patterning layout rule when the plurality of layout segments S1~S15 are photolithographed by the advanced double patterning technology.

Basically, the advanced double patterning technology is a technology using two different masks to photolithograph the substrate of the wafer in succession. The advanced double patterning technology is a double exposure technology for enhancing the feature density on a layer of the integrated circuit. Under the regulation of the advanced double patterning layout rule, a multiple spacing criteria should be complied with. A first spacing criterion is defined by the first predetermined length, i.e. the length G0, which is the minimum allowable length (i.e. spacing) between two adjacent patterns formed on the same mask. A second spacing criterion is defined by the second predetermined length, i.e. the length G0', which is a length larger than the length G0. The length G0' may also be a variable length or a length range as long as the length is larger than the length G0. The lengths G0 and G0' depend on a particular semiconductor fabrication process. For example, a more advanced semiconductor fabrication process has smaller G0 and G0'.

Figure 4:
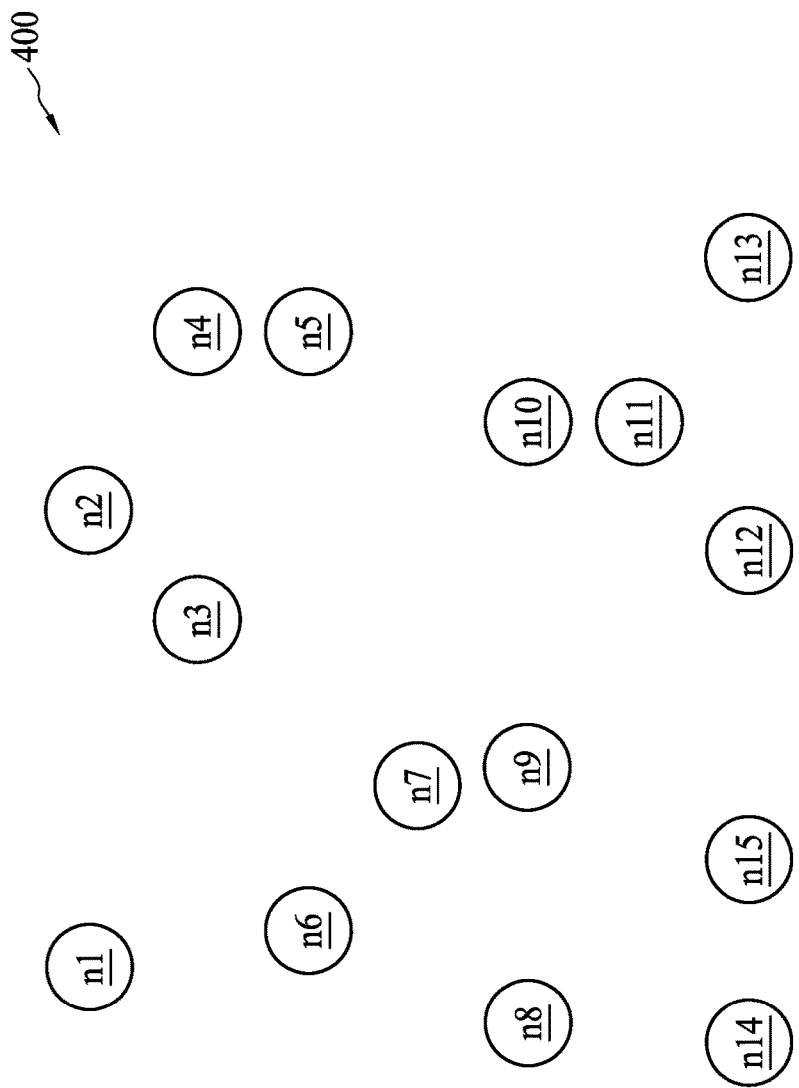
FIG. 4 is a schematic diagram of a simplified illustration of the received layout in accordance with some embodiments.

In operation 206, the plurality of layout segments S1~S15 are represented by a plurality of circular nodes n1~n15 having the same size, respectively, in order to simplify the display of the plurality of layout segments S1~S15. FIG. 4 is a schematic diagram of a simplified illustration 400 of the received layout 300 in accordance with some embodiments. The simplified illustration 400 comprises a plurality of circular nodes n1~n15 corresponding to the plurality of layout segments S1~S15, respectively. The plurality of circular nodes n1~n15 are established according to the shortest distance between each two adjacent layout segments in the plurality of layout segments S1~S15. Therefore, the spaces among the plurality of circular nodes n1~n15 retain the similar characteristic of the spaces among the plurality of layout segments S1~S15. In some embodiments, the plurality of layout segments S1~S15 may be represented by other patterns having the same size or different sizes. In some embodiments, the operation 206 may be an optional operation if, for example, the distribution of a plurality of layout segments on a layer is simple.

Figure 5:
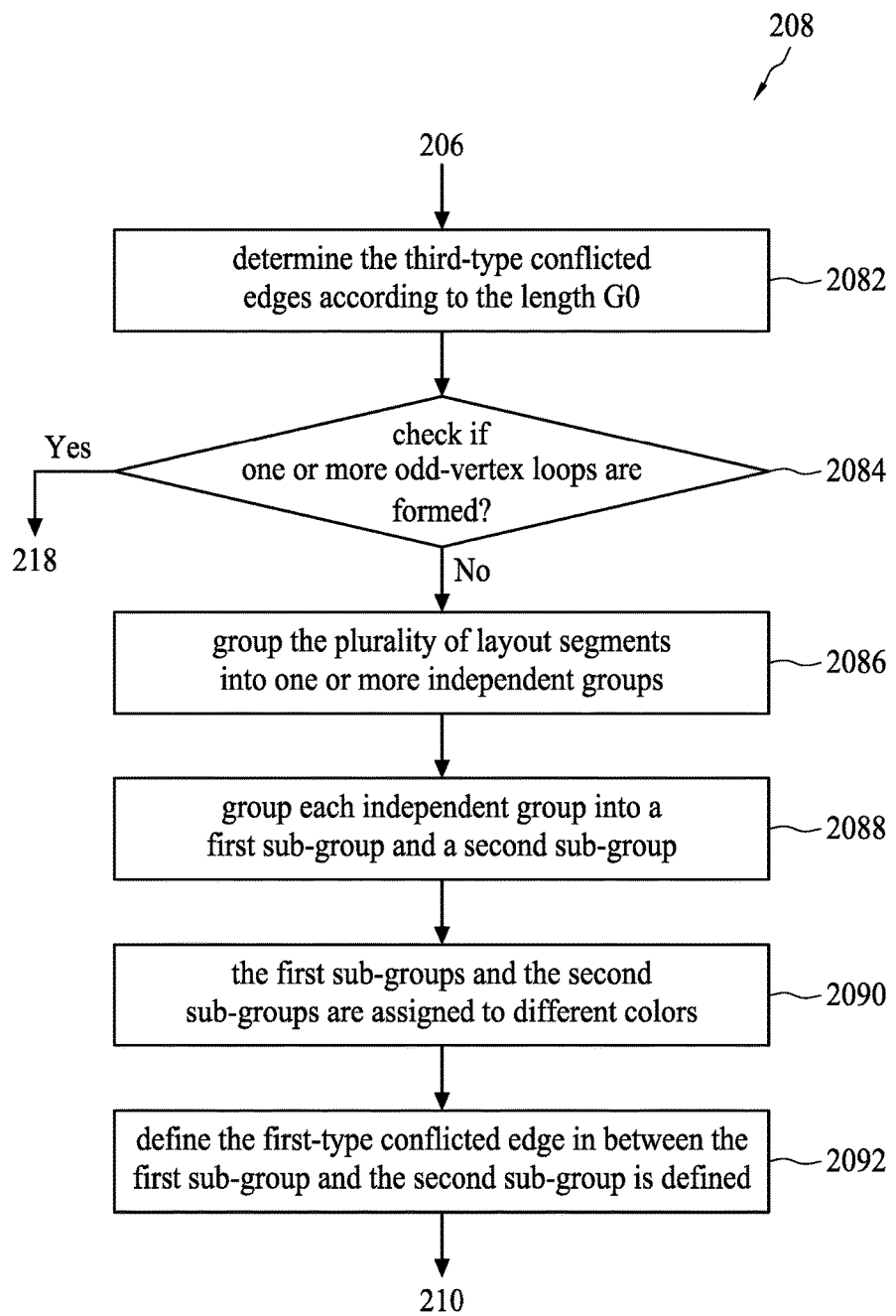
FIG. 5 is a flow diagram illustrating the operation 208 in FIG. 2 in accordance with some embodiments.

In operation 208, spaces among the plurality of layout segments S1~S15 in the layer of the integrated circuit are analyzed to determine if the one or more first-type conflicted edges exist among the plurality of layout segments S1~S15 according to the length G0. FIG. 5 is a flow diagram illustrating the operation 208 in accordance with some embodiments. In operation 2082, spaces among the plurality of layout segments S1~S15 are analyzed to determine one or more third-type conflicted edges according to the length G0. In operation 2084, the one or more third-type conflicted edges are analyzed to check if one or more odd-vertex loops are formed in the plurality of layout segments S1~S15. If not, the operation continues to operation 2086. If so, the operation goes to operation 218. In operation 2086, the plurality of layout segments S1~S15 are grouped into one or more independent groups according to the plurality of third-type conflicted edges. In operation 2088, each independent group in the one or more independent groups is divided into a first sub-group and a second sub-group, wherein no third-type conflicted edges exist in the first sub-group and the second sub-group. In operation 2090, a first color is assigned to the first sub-groups in the plurality of layout segments S1~S15, and a second color different from the first color is assigned to the second sub-groups in the plurality of layout segments S1~S15. In other words, the first sub-groups in the plurality of layout segments S1~S15 are photolithographed by a first mask and the second sub-groups in the plurality of layout segments S1~S15 are photolithographed by a second mask different from the first mask during the exposure process in the semiconductor fabrication process. In operation 2092, for the first sub-group and the second sub-group in each independent group in the plurality of independent groups, one first-type conflicted edge in between the first sub-group and the second sub-group is defined.

Figure 6:
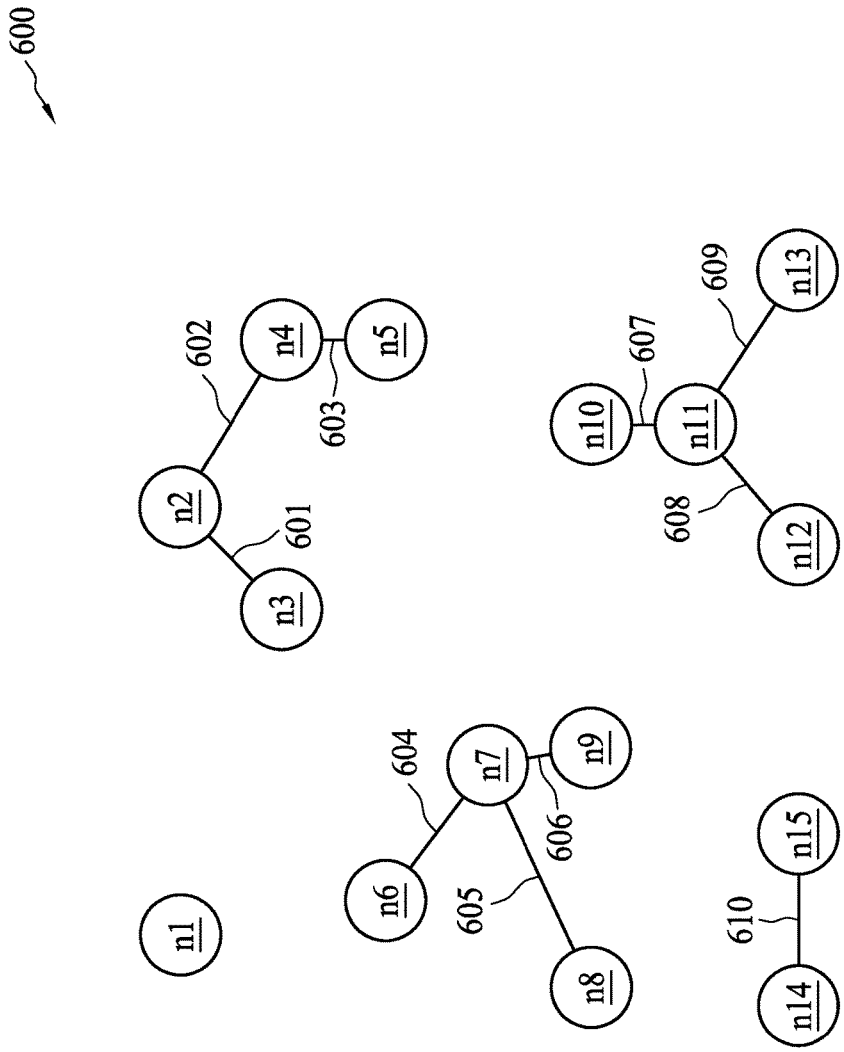
FIG. 6 is a schematic diagram of a simplified illustration of the received layout when the third-type conflicted edges are established in accordance with some embodiments.

In operation 2082, when the space or the shortest distance between two adjacent layout segments in the plurality of layout segments S1~S15 is not greater than the length G0, the third-type conflicted edge is constructed between the two layout segments. For the example of FIG. 3, the spaces between the layout segments S2 and S3, S2 and S4, S4 and S5, S6 and S7, S7 and S8, S7 and S9, S10 and S11, S11 and S12, S11 and S13, and S14 and S15 are smaller than the length G0. Therefore, a plurality of third-type conflicted edges 601~610 are constructed or illustrated between the circular nodes n2 and n3, n2 and n4, n4 and n5, n6 and n7, n7 and n8, n7 and n9, n10 and n11, n11 and n12, n11 and n13, and n14 and n15 as shown in FIG. 6. FIG. 6 is a schematic diagram of a simplified illustration 600 of the received layout 300 when the third-type conflicted edges are established in accordance with some embodiments. The third-type conflicted edge between two conflicted layout segments is represented by a solid line connected between the corresponding two circular nodes, and the solid line should not be treated as a layout path on the layer.

In operation 2084, the illustration 600 in FIG. 6 is checked if one or more odd-vertex loops are formed after the third-type conflicted edges 601~610 are established in the plurality of circular nodes n1~n15. For example, the odd-vertex loop may be regarded as a loop formed by three circular nodes and the solid lines of three third-type conflicted edges. If an odd-vertex loop is formed, meaning that the layout segments on the odd-vertex loop cannot be photolithographed by two different masks in succession. Therefore, when one or more odd-vertex loops are found in the illustration 600, the spacings of the plurality of layout segments S1~S15 may violate the layout design rule of the advanced double patterning photolithography. In operation 218, the plurality of circular nodes or the corresponding layout segments that violate the layout design rule may be highlighted in order to alert the designer or manufacturer that the placement of those layouts needs to be revised.

Figure 7:
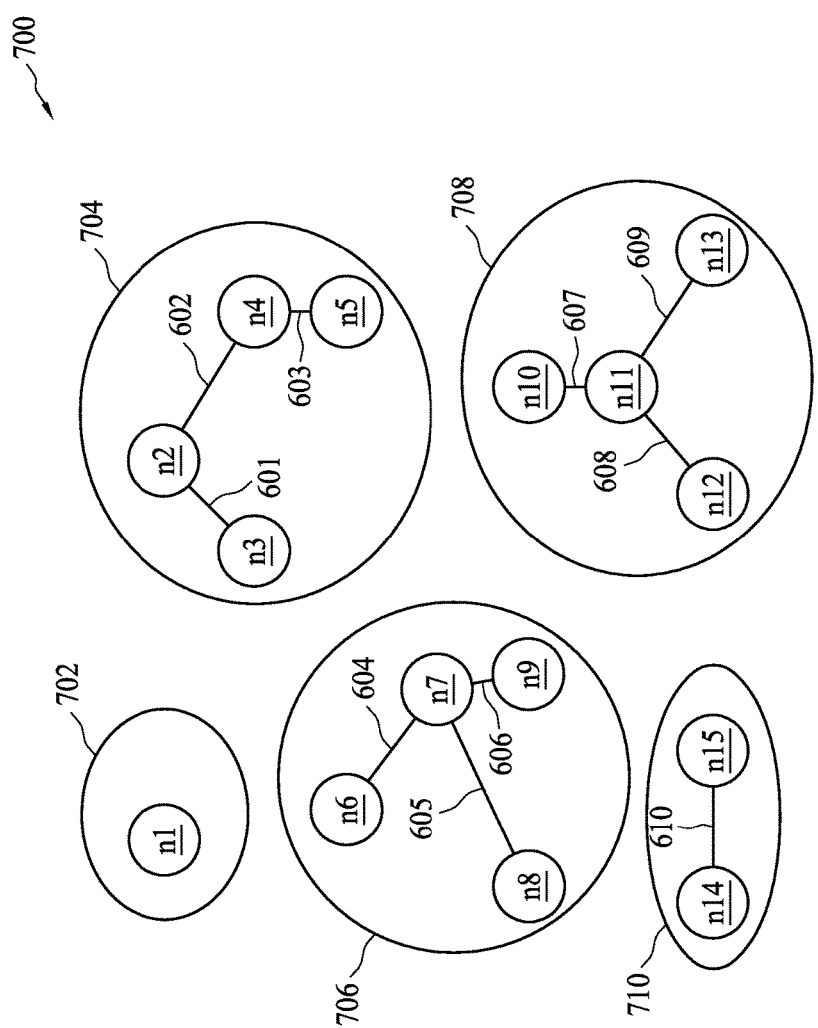
FIG. 7 is a schematic diagram of a simplified illustration of the received layout when circular nodes are grouped into independent groups in accordance with some embodiments.

In FIG. 6, as no odd-vertex loop is formed, the operation proceeds to operation 2086. In operation 2086, the plurality of circular nodes n1~n15 are grouped into a plurality of independent groups 702~710 depending on the distribution of the plurality of third-type conflicted edges 601~610. In some embodiments, the layout checking method 200 regards one or more circular nodes that are connected by the solid line(s) of the third-type conflicted edge(s) as one independent group. Therefore, after the grouping operation 2086, no third-type conflicted edge exists amongst the plurality of independent groups 702~710. As a result, for each independent group in the plurality of independent groups 702~710, the independent group comprises one or more layout segments. If the independent group comprises a plurality of layout segments, then the plurality of layout segments are related layout segments where each related layout segment forms a third-type conflicted edge with at least one adjacent related layout segment in the plurality of related layout segments. For the example of FIG. 7, which is a schematic diagram of a simplified illustration 700 of the received layout 300 when the plurality of circular nodes n1~n15 are grouped into the plurality of independent groups 702~710 in accordance with some embodiments, the layout segments S2~S5 are four critical layout segments because the circular nodes n1~n5 are connected by the solid lines of the third-type conflicted edges 601~603. In other words, the spacings among the layout segments S2~S5 are smaller than the length G0. Similarly, the layout segments S6~S7 are another four critical layout segments in FIG. 7.

In addition, if a layout segment does not have any solid line connected to other layout segment, meaning that there is no third-type conflicted edge around the layout segment, then the independent group comprises only one layout segment. For example, the circuit node n1 is the only circuit node in the independent group 702. Therefore, there is no third-type conflicted edge around the layout segment S1.

Figure 8:
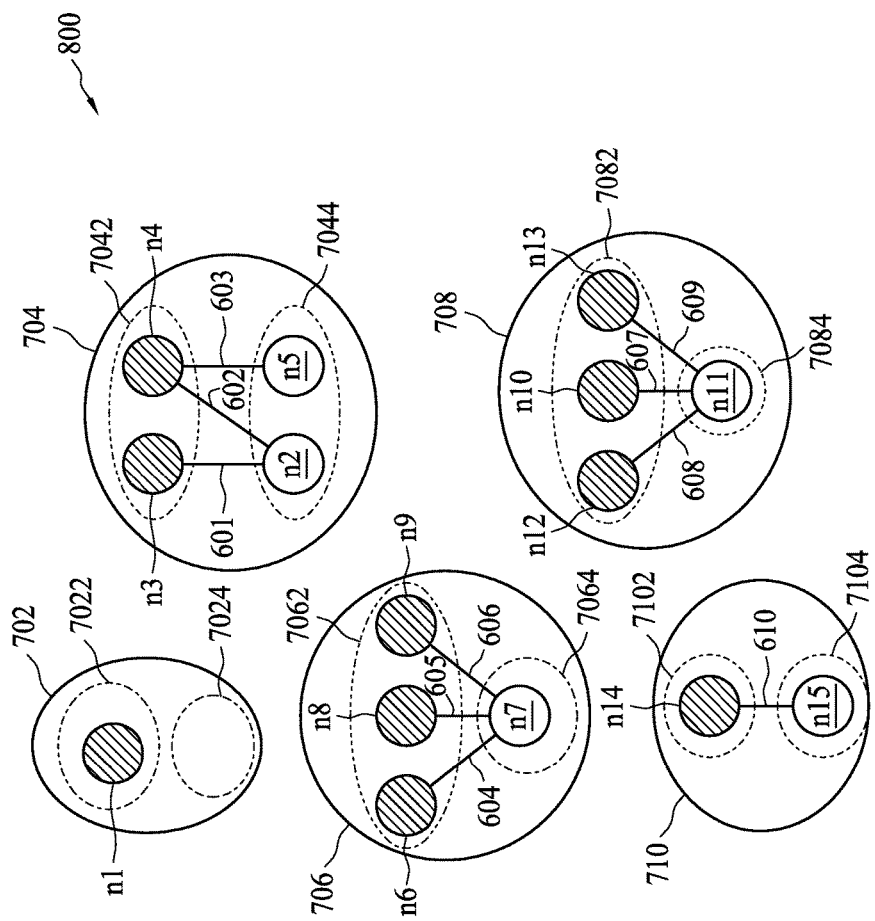
FIG. 8 is a schematic diagram of a simplified illustration of the received layout when the circular nodes in each independent group in the plurality of independent groups are grouped into the first sub-group and the second sub-group in accordance with some embodiments.

In operation 2088, the one or more circular nodes in each independent group of the plurality of independent groups 702~708 are grouped into two sub-groups, i.e. the first sub-group and the second sub-group, in order to distinguish the one or more circular nodes in the independent group. For an independent group, the first sub-group and the second sub-group are to be assigned to different masks. More particularly, in one independent group, the layout segment(s) in the first sub-group is to be photolithographed by the first mask and the layout segment(s) in the second sub-group is to be photolithographed by the second mask different from the first mask during the exposure process in the semiconductor fabrication process. Therefore, for an independent group, there may not have any third-type conflicted edge arises between two layout segments in the first sub-group, and may not have any third-type conflicted edge arises between two layout segments in the second sub-group. Therefore, after the one or more circular nodes in each independent group of the plurality of independent groups 702~708 are grouped into the first sub-group and the second sub-group, the solid line(s) only exists in between the first sub-group and the second sub-group, and no solid line exists in the first sub-group and the second sub-group as shown in FIG. 8. FIG. 8 is a schematic diagram of a simplified illustration 800 of the received layout 300 when the circular node(s) in each independent group in the plurality of independent groups 702~710 are grouped into the first sub-group and the second sub-group in accordance with some embodiments. In FIG. 8, the first sub-groups are labelled as 7022, 7042, 7062, 7082, and 7102, and the second sub-groups are labelled as 7024, 7044, 7064, 7084, and 7104.

In addition, if an independent group comprises only one layout segment, then the only one layout segment may be grouped into either the first sub-group or the second sub-group. More particularly, if the only one layout segment is grouped into the first sub-group, then the second sub-group in the independent group comprises no layout segment. If the only one layout segment is grouped into the second sub-group, then the first sub-group in the independent group comprises no layout segment. In some embodiments, if an independent group comprises only one layout segment, then the only one layout segment may just be assigned to one of the first sub-group and the second sub-group because there is no third-type conflicted edge around the only one layout segment. For example, the independent group 702 comprises only one circular node n1. Therefore, the circular node n1 is grouped into the first sub-group 7022, and the second sub-group 7024 comprises no circuit node.

In operation 2090, the first sub-groups 7022, 7042, 7062, 7082, 7102, and the second sub-groups 7024, 7044, 7064, 7084, 7104 are assigned to/displayed with different colors, i.e. the first color and the second color, such that the designer or manufacturer can distinguish the assignment of the first mask and the second mask in a more easy way. In FIG. 8, the circular nodes with the slash are assigned to the first color whereas the circular nodes without the slash are assigned to the second color. It should be noted that the mask assignment in FIG. 8 is just an exemplary embodiment. The first sub-groups 7022, 7042, 7062, 7082, and 7102 may not be all assigned to the first mask, and the second sub-groups 7024, 7044, 7064, 7084, and 7104 may also not be all assigned to the second mask. The sub-groups 7022, 7042, 7062, 7082, 7102, 7024, 7044, 7064, 7084, and 7104 may be assigned to the first mask and the second mask in different combinations as long as the sub-groups in an independent group are not assigned to the same mask. For example, in another embodiment, the sub-groups that are assigned to the first mask may be 7022, 7044, 7064, 7082, and 7102, and the sub-groups that are assigned to the second mask may be 7042, 7062, 7084, and 7104. The sub-group 7022 may be assigned to any of the first mask and the second mask because the sub-group 7022 is only one sub-group in the independent group 702.

Figure 9:
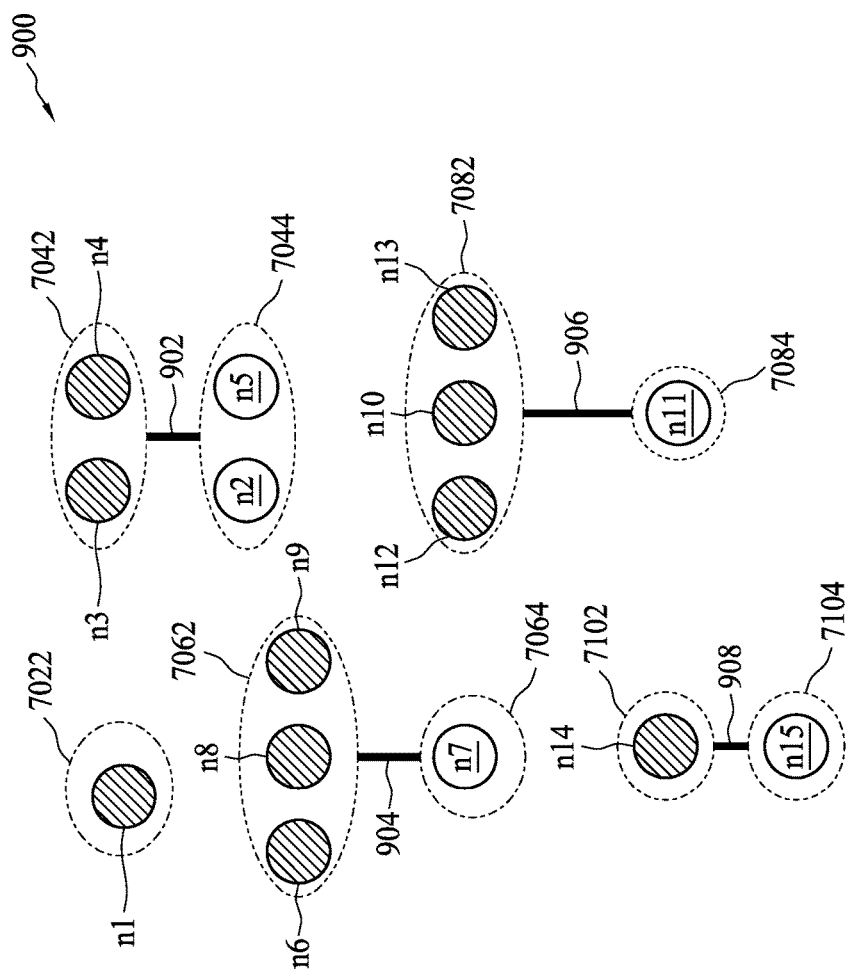
FIG. 9 is a schematic diagram of a simplified illustration of the received layout when the first-type conflicted edge is defined in between the first sub-group and the second sub-group in each of the plurality of independent groups in accordance with some embodiments.

In operation 2092, when the circular node(s) in each independent group in the plurality of independent groups 702~710 are grouped into the first sub-group and the second sub-group, the solid line(s) connecting the first sub-group and the second sub-group of an independent group is replaced with one bold solid line. A bold solid line connecting the first sub-group and the second sub-group means the first-type conflicted edge arises between the first sub-group and the second sub-group. Therefore, the first-type conflicted edge can be regarded as a general G0 exists in between the first sub-group and the second sub-group. FIG. 9 is a schematic diagram of a simplified illustration 900 of the received layout 300 when the first-type conflicted edge is defined in between the first sub-group and the second sub-group in each of the plurality of independent groups 702~710 in accordance with some embodiments. The plurality of first-type conflicted edges in FIG. 9 are represented by a plurality of bold solid lines 902~908 respectively. For example, the first-type conflicted edge arises between the first sub-group 7042 and the second sub-group 7044 as the bold solid line 902 is connected between the first sub-group 7042 and the second sub-group 7044.

In addition, if an independent group comprises only one sub-group, either the first sub-group or the second sub-group, meaning that no first-type conflicted edge is detected around the only one sub-group, then no bold solid line is connected to the only one sub-group. For example, if the first sub-group 7022 is the only one sub-group in the independent group 702, then no bold solid line is connected to the first sub-group 7022.

Figure 10:
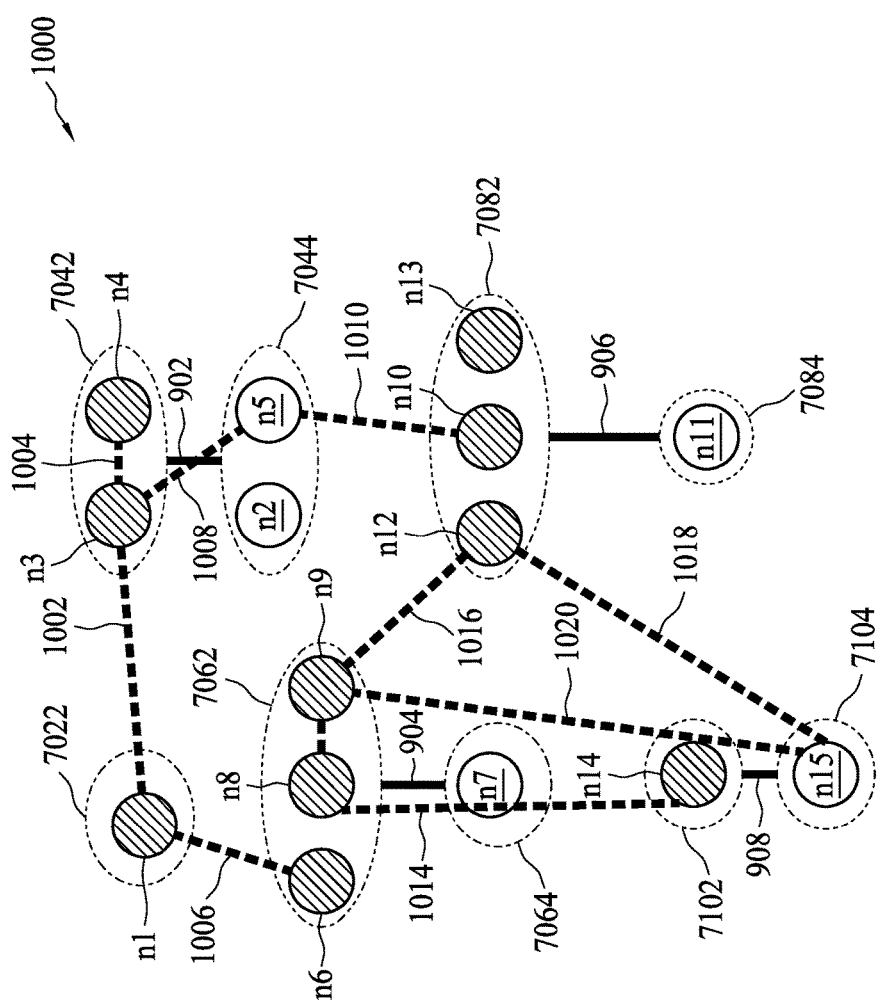
FIG. 10 is a schematic diagram of a simplified illustration of the received layout when the potential conflicted edges are constructed among the plurality of circular nodes in accordance with some embodiments.

Back to FIG. 2, in operation 210, when the space or the shortest distance between two adjacent layout segments in the plurality of layout segments S1~S15 equals the second predetermined length, i.e. the length G0', a potential conflicted edge is constructed between the two layout segments. A potential conflicted edge is represented by a bold dotted line as shown in FIG. 10. FIG. 10 is a schematic diagram of a simplified illustration 1000 of the received layout 300 when the potential conflicted edges are constructed among the plurality of circular nodes n1~n15 in accordance with some embodiments. The potential conflicted edges among the plurality of circular nodes n1~n15 are represented by a plurality of bold dotted lines 1002~1020 respectively. For example, the potential conflicted edge 1002 is connected between the first circular node n1 and the third circular node n3, and this means that the distance between the layout segment S1 and the layout segment S3 equals the length G0'.

Figure 11:
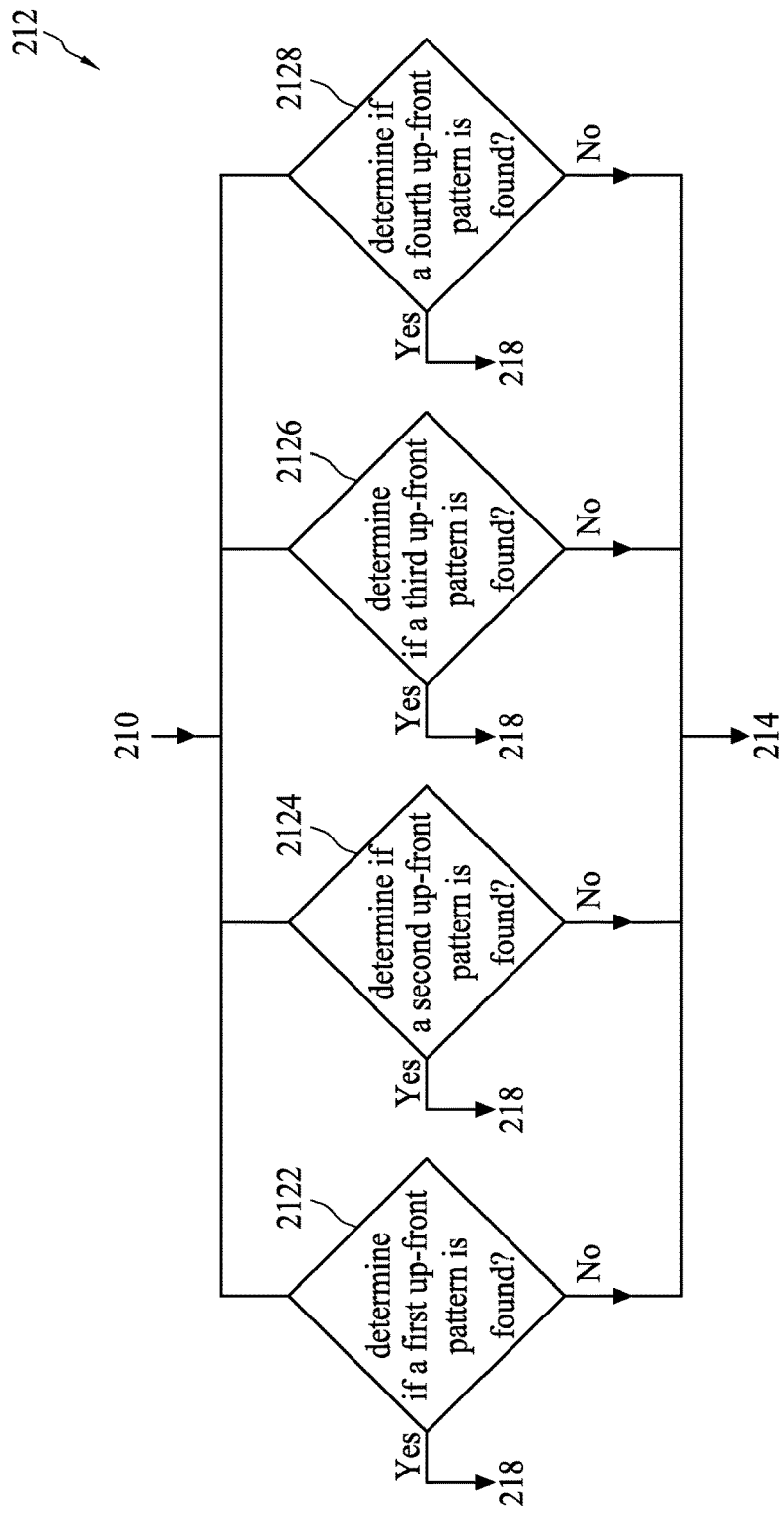
FIG. 11 is a flow diagram illustrating the operation 212 in FIG. 2 in accordance with some embodiments.

When the first-type conflicted edges 902~908 and the potential conflicted edges 1002~1020 in the received layout 300 are determined, the layout checking method 200 performs the up-front checking process i.e., the operation 212, to check if a violation occurs in the plurality of layout segments S1~S15 before moving on to the operation 214. FIG. 11 is a flow diagram illustrating the operation 212 in accordance with some embodiments. In operation 2122, a first up-front pattern is checked. The first-type conflicted edges 902~908 and the potential conflicted edges 1002~1020 obtained in the operation 210 are analyzed to determine if a first potential conflicted edge arises between a first related layout segment and a second related layout segment in the first sub-group of a first independent group and if a second potential conflicted edge arises between the second related layout segment and a third related layout segment in the first sub-group of a first independent group. When the first potential conflicted edge and the second potential conflicted edge are detected, meaning that the first up-front pattern is found, and the method continues to operation 218. When the first potential conflicted edge and the second potential conflicted edge are not detected, the method continues to operation 214.

Figure 12:
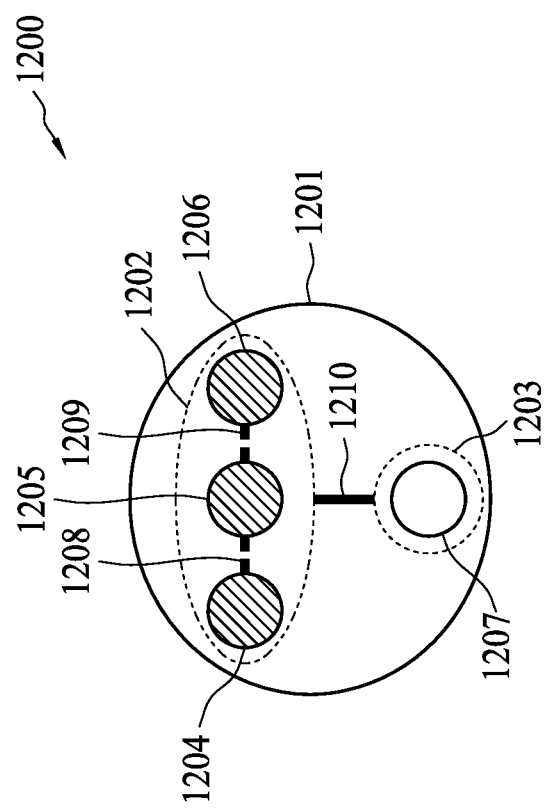
FIG. 12 is a schematic diagram of a first up-front pattern being checked in the operation 2122 in FIG. 11 of the up-front checking process in accordance with some embodiments.

More particularly, the up-front checking pattern in the operation 2122 can be simplified into the pattern as shown in FIG. 12. FIG. 12 is a schematic diagram of a first up-front pattern 1200 being checked in the operation 2122 of the up-front checking process 212 in accordance with some embodiments. For an independent group 1201, the independent group 1201 comprises a first sub-group 1202 and a second sub-group 1203, wherein the circular nodes 1204~1206 in the first sub-group 1202 are assigned to the first mask, and the circular node 1207 in the second sub-group 1203 is assigned to the second mask. The first-type conflicted edge 1210 arises between the first sub-group 1202 and the second sub-group 1203. When the first potential conflicted edge 1208 arises between the first circular node 1204 and the second circular node 1205, and when the second potential conflicted edge 1209 arises between the second circular node 1205 and the third circular node 1206, then the layout placement of the layout segments in the first sub-group 1202 violates the design rule of the advanced double patterning photolithography. In other words, if the first up-front pattern 1200 is found in the operation 2122, a design rule violation occurs and the corresponding layout segments or circular nodes (e.g. the circular nodes 1204~1206) are highlighted.

In operation 2124, a second up-front pattern is checked. The first-type conflicted edges 902~908 and the potential conflicted edges 1002~1020 obtained in the operation 210 are analyzed to determine if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, if a third potential conflicted edge arises between the first related layout segment in the first sub-group of the first independent group and a fourth related layout segment in the first sub-group of a third independent group, and if a fourth potential conflicted edge arises between the first related layout segment in the first sub-group of the first independent group and a fifth related layout segment in the second sub-group of the third independent group. When the first potential conflicted edge, the second potential conflicted edge, the third potential conflicted edge, and the fourth potential conflicted edge are detected, meaning that the second up-front pattern is found, and the method continues to operation 218. When the first potential conflicted edge, the second potential conflicted edge, the third potential conflicted edge, and the fourth potential conflicted edge are not detected, the method continues to operation 214.

Figure 13:
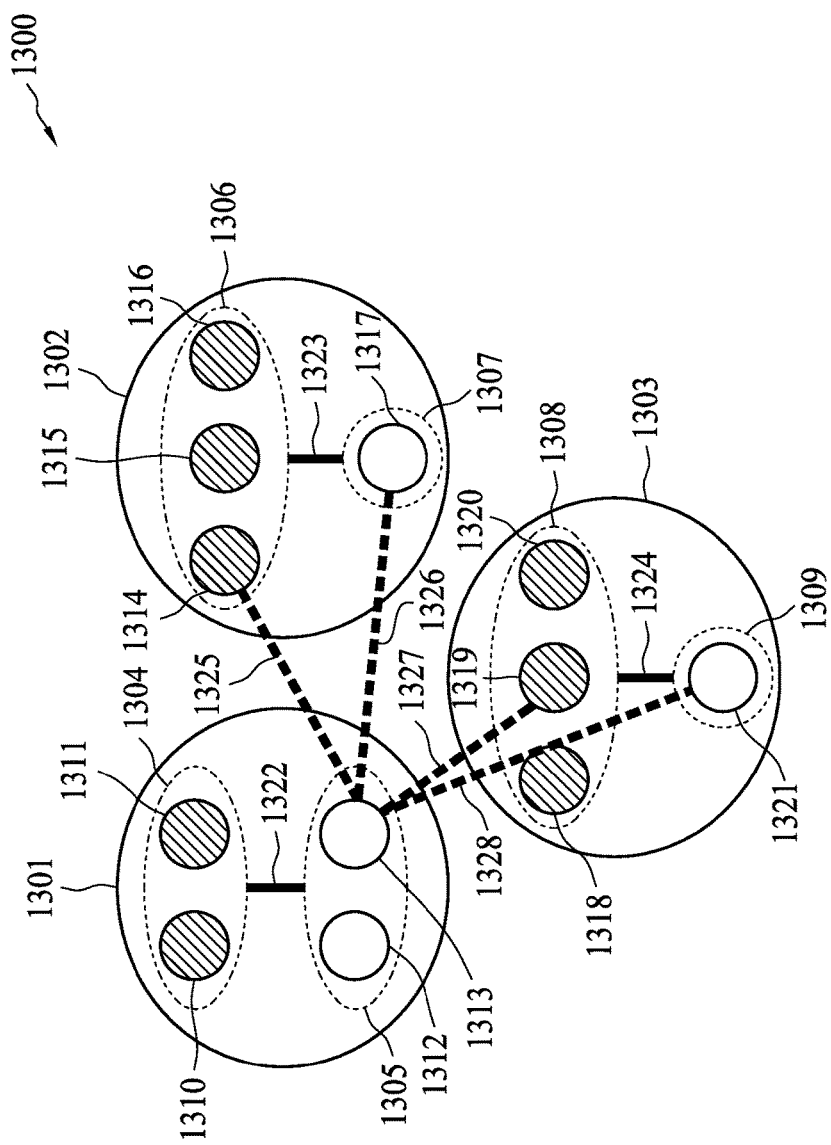
FIG. 13 is a schematic diagram of a second up-front pattern being checked in the operation 2124 in FIG. 11 of the up-front checking process in accordance with some embodiments.

More particularly, the up-front checking pattern in the operation 2124 can be simplified into the pattern as shown in FIG. 13. FIG. 13 is a schematic diagram of a second up-front pattern 1300 being checked in the operation 2124 of the up-front checking process 212 in accordance with some embodiments. For three independent groups 1301, 1302, and 1303, the first independent group 1301 comprises a first sub-group 1304 and a second sub-group 1305, wherein the circular nodes 1310~1311 in the first sub-group 1304 are assigned to the first mask, and the circular nodes 1312~1313 in the second sub-group 1305 are assigned to the second mask. The second independent group 1302 comprises a first sub-group 1306 and a second sub-group 1307, wherein the circular nodes 1314~1316 in the first sub-group 1306 are assigned to the first mask, and the circular node 1317 in the second sub-group 1307 is assigned to the second mask. The third independent group 1303 comprises a first sub-group 1308 and a second sub-group 1309, wherein the circular nodes 1318~1320 in the first sub-group 1308 are assigned to the first mask, and the circular node 1309 in the second sub-group 1321 is assigned to the second mask. The first-type conflicted edges 1322, 1323, and 1324 arise between the first sub-group 1304 and the second sub-group 1305, the first sub-group 1306 and the second sub-group 1307, and the first sub-group 1308 and the second sub-group 1309 respectively. When the first potential conflicted edge 1325 arises between the circular node 1313 in the second sub-group 1305 of the first independent group 1301 and one of the circular node (i.e. 1314, 1315, or 1316) in the first sub-group 1306 of the second independent group 1302, when the second potential conflicted edge 1326 arises between the circular node 1313 in the second sub-group 1305 of the first independent group 1301 and one of the circular node (i.e. 1317) in the second sub-group 1307 of the second independent group 1302, when the third potential conflicted edge 1327 arises between the circular node 1313 in the second sub-group 1305 of the first independent group 1301 and one of the circular node (i.e. 1318, 1319, or 1320) in the first sub-group 1308 of the third independent group 1303, and when the fourth potential conflicted edge 1328 arises between the circular node 1313 in the second sub-group 1305 of the first independent group 1301 and one of the circular node (i.e. 1321) in the second sub-group 1309 of the third independent group 1303, then the layout placement of the layout segments in the second sub-group 1305, the first sub-group 1306, the second sub-group 1307, the first sub-group 1308, and the second sub-group 1309 violates the design rule of the advanced double patterning photolithography. In other words, if the second up-front pattern 1300 is found in the operation 2124, a design rule violation occurs and the corresponding layout segments or circular nodes (e.g. the circular nodes in the second sub-group 1305, the first sub-group 1306, the second sub-group 1307, the first sub-group 1308, and the second sub-group 1309) are highlighted.

In operation 2126, a third up-front pattern is checked. The first-type conflicted edges 902~908 and the potential conflicted edges 1002~1020 obtained in the operation 210 are analyzed to determine if a first potential conflicted edge arises between a first related layout segment and a second related layout segment in the first sub-group of a first independent group, if a second potential conflicted edge arises between the second related layout segment in the first sub-group of the first independent group and a third related layout segment in the first sub-group of a second independent group, and if a third potential conflicted edge arises between the second related layout segment in the first sub-group of the first independent group and a fourth related layout segment in the second sub-group of the second independent group. When the first potential conflicted edge, the second potential conflicted edge, and the third potential conflicted edge are detected, meaning that the third up-front pattern is found, and the method continues to operation 218. When the first potential conflicted edge, the second potential conflicted edge, and the third potential conflicted edge are not detected, the method continues to operation 214.

Figure 14:
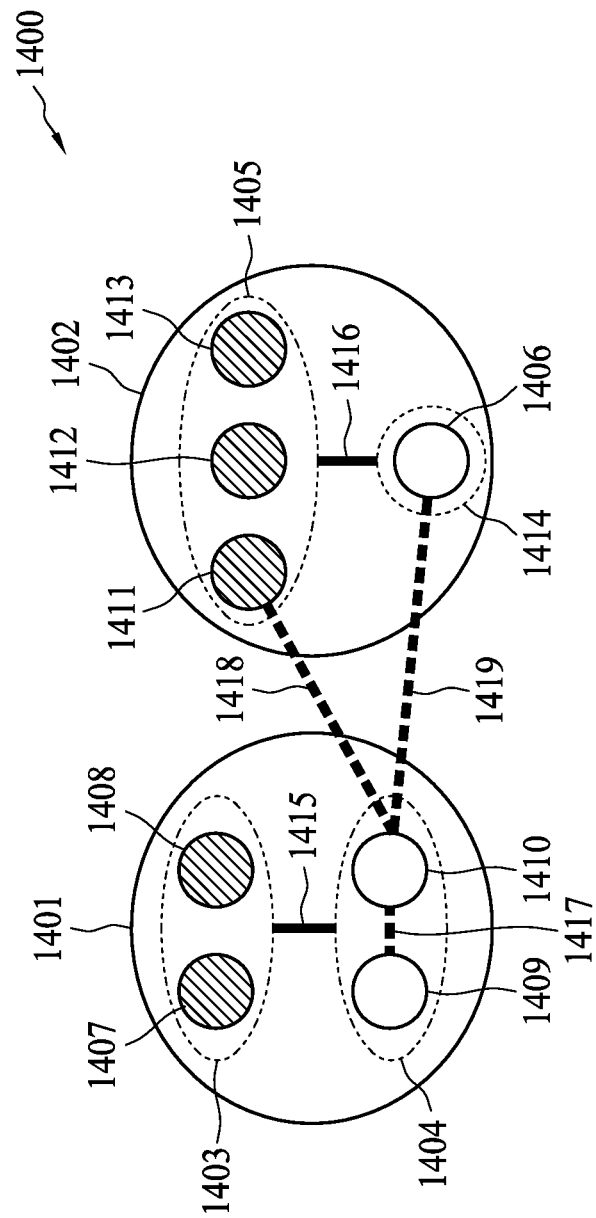
FIG. 14 is a schematic diagram of a third up-front pattern being checked in the operation 2126 in FIG. 11 of the up-front checking process in accordance with some embodiments.

More particularly, the up-front checking pattern in the operation 2126 can be simplified into the pattern as shown in FIG. 14. FIG. 14 is a schematic diagram of a third up-front pattern 1400 being checked in the operation 2126 of the up-front checking process 212 in accordance with some embodiments. For two independent groups 1401 and 1402, the first independent group 1401 comprises a first sub-group 1403 and a second sub-group 1404, wherein the circular nodes 1407~1408 in the first sub-group 1403 are assigned to the first mask, and the circular nodes 1409~1410 in the second sub-group 1404 are assigned to the second mask. The second independent group 1402 comprises a first sub-group 1405 and a second sub-group 1406, wherein the circular nodes 1411~1413 in the first sub-group 1405 are assigned to the first mask, and the circular node 1414 in the second sub-group 1406 is assigned to the second mask. The first-type conflicted edges 1415 and 1416 arise between the first sub-group 1403 and the second sub-group 1404, and the first sub-group 1405 and the second sub-group 1406, respectively. When the first potential conflicted edge 1417 arises between the first circular node 1409 and the second circular node 1410 in the second sub-group 1404 of the first independent group 1401, when the second potential conflicted edge 1418 arises between the second circular node 1410 in the second sub-group 1404 of the first independent group 1401 and one of the circular nodes (i.e. 1411, 1412, or 1413) in the first sub-group 1405 of the second independent group 1402, and when the third potential conflicted edge 1419 arises between the second circular node 1410 in the second sub-group 1404 of the first independent group 1401 and one of the circular node (i.e. 1414) in the second sub-group 1406 of the second independent group 1402, then the layout placement of the layout segments in the second sub-group 1404, the first sub-group 1405, and the second sub-group 1406 violates the design rule of the advanced double patterning photolithography. In other words, if the third up-front pattern 1400 is found in the operation 2126, a design rule violation occurs and the corresponding layout segments or circular nodes (e.g. the circular nodes in the second sub-group 1404, the first sub-group 1405, and the second sub-group 1406) are highlighted.

In operation 2128, a fourth up-front pattern is checked. The first-type conflicted edges 902~908 and the potential conflicted edges 1002~1020 obtained in the operation 210 are analyzed to determine if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a second related layout segment in the first sub-group of the second independent group, if a third potential conflicted edge arises between the first related layout segment in the first sub-group of the first independent group and a fourth related layout segment in the second sub-group of the second independent group, and if a fourth potential conflicted edge arises between the first related layout segment in the first sub-group of the first independent group and a fifth related layout segment in the second sub-group of the second independent group. When the first potential conflicted edge, the second potential conflicted edge, the third potential conflicted edge, and the fourth potential conflicted edge are detected, meaning that the fourth up-front pattern is found, and the method continues to operation 218. When the first potential conflicted edge, the second potential conflicted edge, the third potential conflicted edge, and the fourth potential conflicted edge are not detected, the method continues to operation 214.

Figure 15:
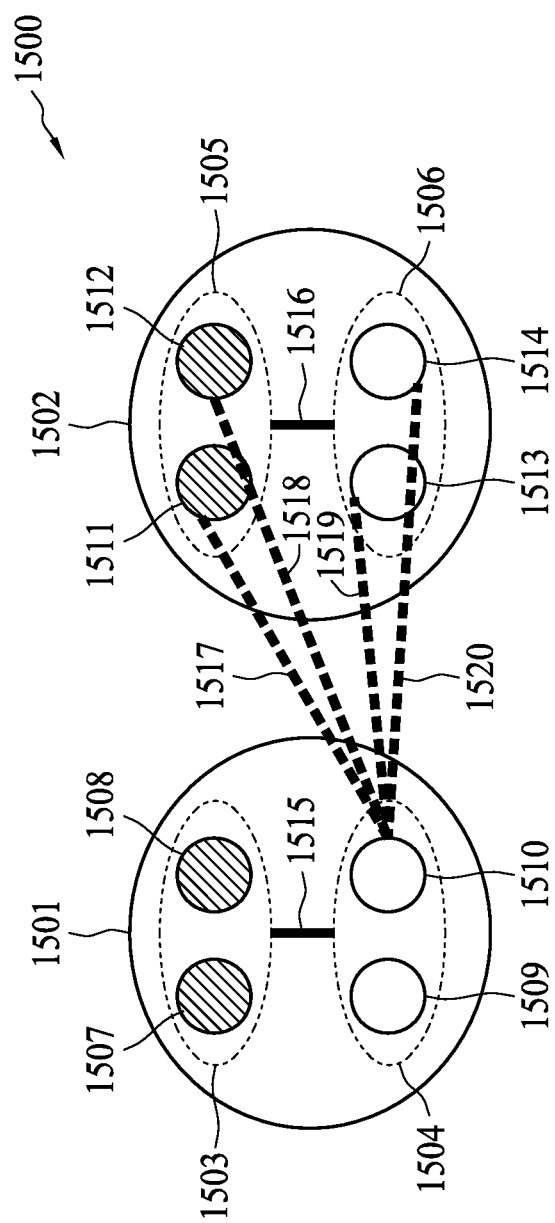
FIG. 15 is a schematic diagram of a fourth up-front pattern being checked in the operation 2128 in FIG. 11 of the up-front checking process in accordance with some embodiments.

More particularly, the up-front checking pattern in the operation 2128 can be simplified into the pattern as shown in FIG. 15. FIG. 15 is a schematic diagram of a fourth up-front pattern 1500 being checked in the operation 2128 of the up-front checking process 212 in accordance with some embodiments. For two independent groups 1501 and 1502, the first independent group 1501 comprises a first sub-group 1503 and a second sub-group 1504, wherein the circular nodes 1507~1508 in the first sub-group 1503 are assigned to the first mask, and the circular nodes 1509~1510 in the second sub-group 1504 are assigned to the second mask. The second independent group 1502 comprises a first sub-group 1505 and a second sub-group 1506, wherein the circular nodes 1511~1513 in the first sub-group 1505 are assigned to the first mask, and the circular nodes 1513~1514 in the second sub-group 1506 is assigned to the second mask. The first-type conflicted edges 1515 and 1516 arise between the first sub-group 1503 and the second sub-group 1504, and the first sub-group 1505 and the second sub-group 1506, respectively. When the first potential conflicted edge 1517 arises between the circular node 1510 in the second sub-group 1504 of the first independent group 1501 and the first circular node 1511 in the first sub-group 1505 of the second independent group 1502, when the second potential conflicted edge 1518 arises between the circular node 1510 in the second sub-group 1504 of the first independent group 1501 and the second circular node 1512 in the first sub-group 1505 of the second independent group 1502, when the third potential conflicted edge 1519 arises between the circular node 1510 in the second sub-group 1504 of the first independent group 1501 and the first circular node 1513 in the second sub-group 1506 of the second independent group 1502, and when the fourth potential conflicted edge 1520 arises between the circular node 1510 in the second sub-group 1504 of the first independent group 1501 and the second circular node 1514 in the second sub-group 1506 of the second independent group 1502, then the layout placement of the layout segments in the second sub-group 1504, the first sub-group 1505, and the second sub-group 1506 violates the design rule of the advanced double patterning photolithography. In other words, if the fourth up-front pattern 1500 is found in the operation 2128, a design rule violation occurs and the corresponding layout segments or circular nodes (e.g. the circular nodes in the second sub-group 1504, the first sub-group 1505, and the second sub-group 1506) are highlighted.

Figure 16:
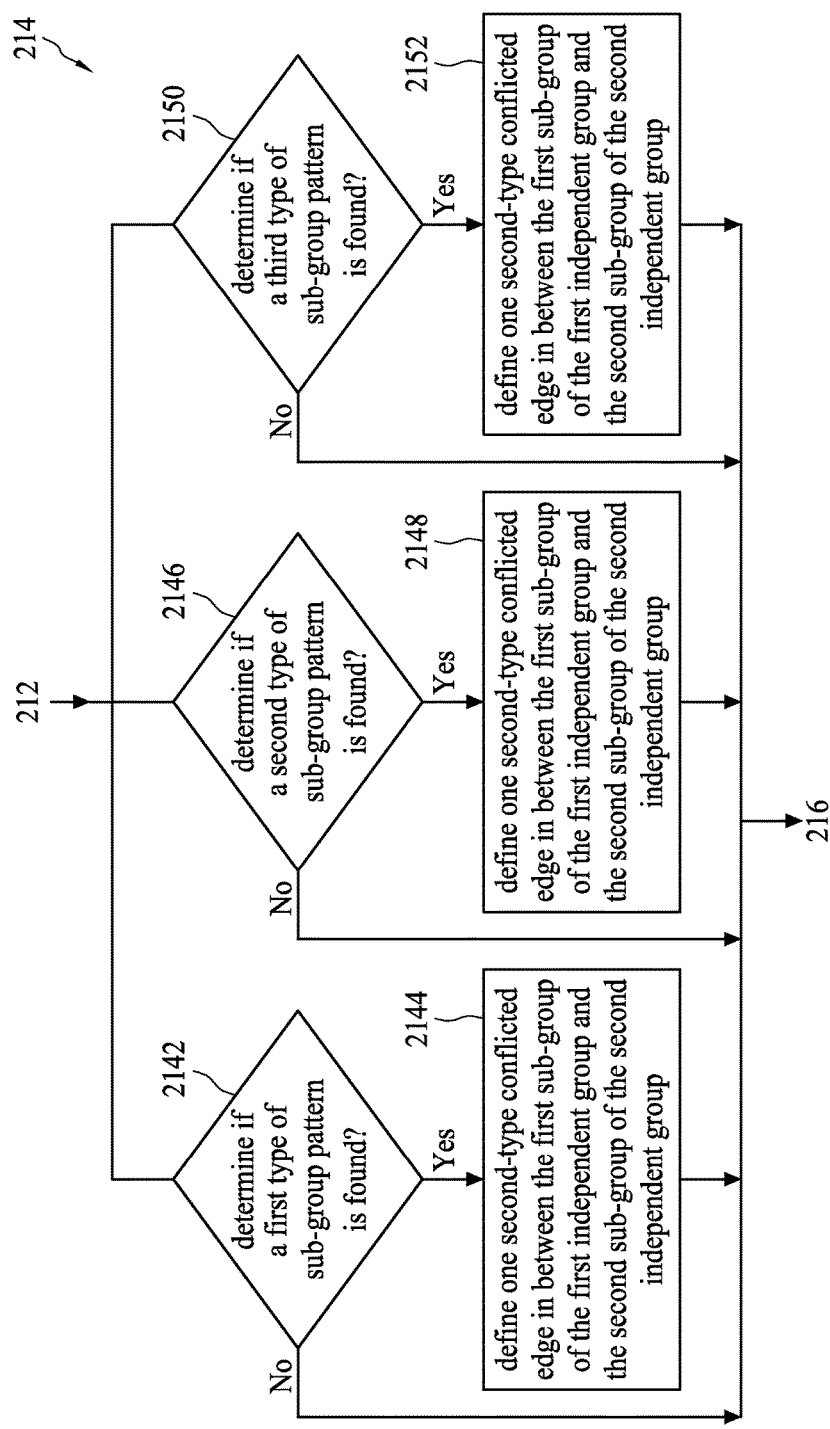
FIG. 16 is a flow diagram illustrating the operation 214 in FIG. 2 in accordance with some embodiments.

If no up-front violation is found in the operation 212, the layout checking method 200 proceeds to operation 214 to determine the second-type conflicted edge(s) from the potential conflicted edge(s). FIG. 16 is a flow diagram illustrating the operation 214 in accordance with some embodiments. In operation 2142, a first type of sub-group pattern is checked. The first-type conflicted edges 902~908 and the potential conflicted edges 1002~1020 obtained in the operation 210 are analyzed to determine if a first potential conflicted edge arises between a first related layout segment and a second related layout segment in the first sub-group of a first independent group, and if a second potential conflicted edge arises between the second related layout segment in the first sub-group of the first independent group and a third related layout segment in the second sub-group of a second independent group. When the first potential conflicted edge and the second potential conflicted edge are detected, meaning that the first type of sub-group pattern is found, and the method continues to operation 2144 to define one second-type conflicted edge in between the first sub-group of the first independent group and the second sub-group of the second independent group and to discard the first potential conflicted edge and the second potential conflicted edge from the illustration 1000. When the first potential conflicted edge and the second potential conflicted edge are not detected, the method continues to operation 216.

Figure 17:
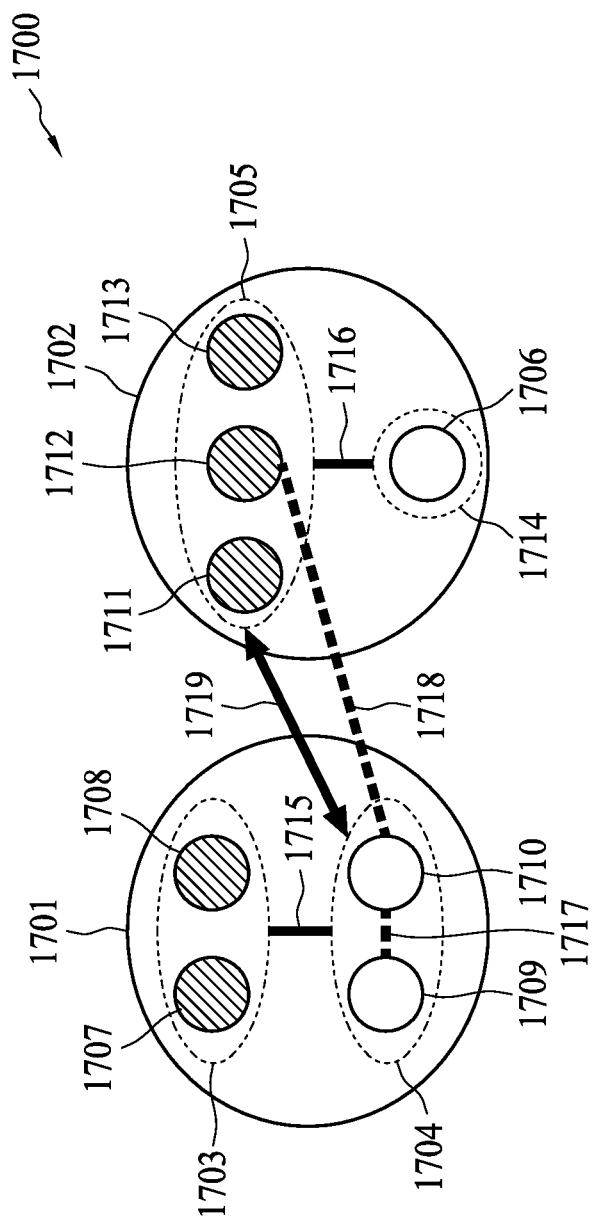
FIG. 17 is a schematic diagram of a simplified pattern being checked in the operation 2142 in FIG. 16 in accordance with some embodiments.

More particularly, the second-type conflicted edge checking pattern in the operation 2142 can be simplified into the pattern as shown in FIG. 17. FIG. 17 is a schematic diagram of a simplified pattern 1700 being checked in the operation 2142 in accordance with some embodiments. For two independent groups 1701 and 1702, the first independent group 1701 comprises a first sub-group 1703 and a second sub-group 1704, wherein the circular nodes 1707~1708 in the first sub-group 1703 are assigned to the first mask, and the circular nodes 1709~1710 in the second sub-group 1704 are assigned to the second mask. The second independent group 1702 comprises a first sub-group 1705 and a second sub-group 1706, wherein the circular nodes 1711~1713 in the first sub-group 1705 are assigned to the first mask, and the circular node 1714 in the second sub-group 1706 is assigned to the second mask. The first-type conflicted edges 1715 and 1716 arise between the first sub-group 1703 and the second sub-group 1704, and the first sub-group 1705 and the second sub-group 1706, respectively. When the first potential conflicted edge 1717 arises between the first circular node 1709 and the second circular node 1710 in the second sub-group 1704 of the first independent group 1701, and when the second potential conflicted edge 1718 arises between the second circular node 1710 in the second sub-group 1704 of the first independent group 1701 and one of the circular node (i.e. 1711, 1712, or 1713) in the first sub-group 1705 of the second independent group 1702, then the method continues to operation 2144 to define the second-type conflicted edge 1719 in between the second sub-group 1704 of the first independent group 1701 and the first sub-group 1705 of the second independent group 1702. The second-type conflicted edge 1719 is represented by an arrow-bold line.

In operation 2146, a second type of sub-group pattern is checked. The first-type conflicted edges 902~908 and the potential conflicted edges 1002~1020 obtained in the operation 210 are analyzed to determine if a first potential conflicted edge arises between a first related layout segment in the first sub-group of a first independent group and a second related layout segment in the second sub-group of a second independent group, and if a second potential conflicted edge arises between the first related layout segment in the first sub-group of the first independent group and a third related layout segment in the second sub-group of the second independent group. When the first potential conflicted edge and the second potential conflicted edge are detected, meaning that the second type of sub-group pattern is found, and the method continues to operation 2148 to define one second-type conflicted edge in between the first sub-group of the first independent group and the second sub-group of the second independent group and to discard the first potential conflicted edge and the second potential conflicted edge from the illustration 1000. When the first potential conflicted edge and the second potential conflicted edge are not detected, the method continues to operation 216.

Figure 18:
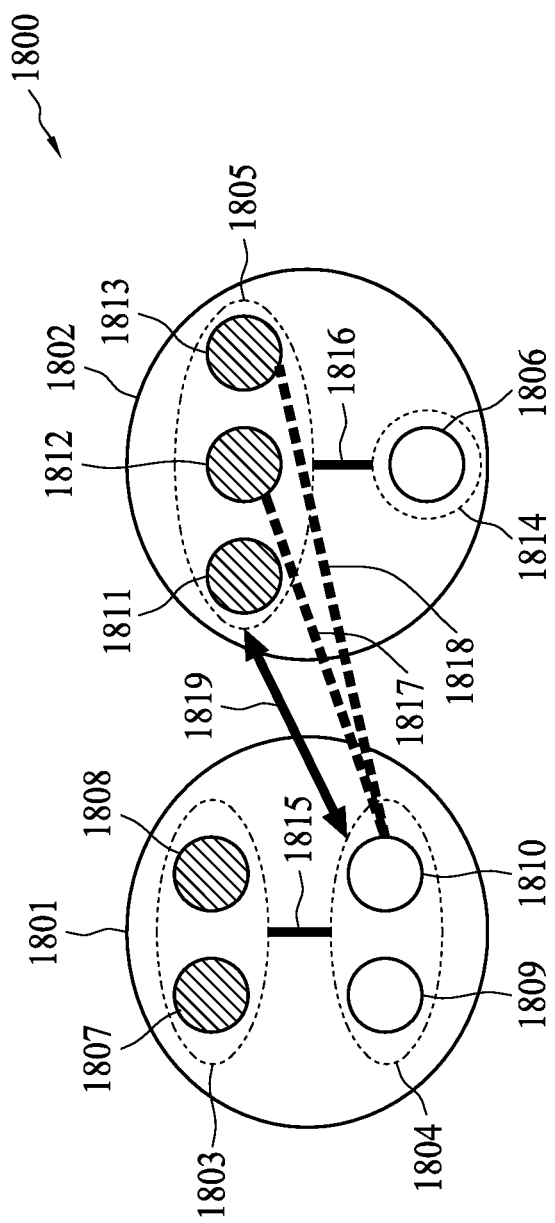
FIG. 18 is a schematic diagram of a simplified pattern being checked in the operation 2146 in FIG. 16 in accordance with some embodiments.

More particularly, the second-type conflicted edge checking pattern in the operation 2146 can be simplified into the pattern as shown in FIG. 18. FIG. 18 is a schematic diagram of a simplified pattern 1800 being checked in the operation 2146 in accordance with some embodiments. For two independent groups 1801 and 1802, the first independent group 1801 comprises a first sub-group 1803 and a second sub-group 1804, wherein the circular nodes 1807~1808 in the first sub-group 1803 are assigned to the first mask, and the circular nodes 1809~1810 in the second sub-group 1804 are assigned to the second mask. The second independent group 1802 comprises a first sub-group 1805 and a second sub-group 1806, wherein the circular nodes 1811~1813 in the first sub-group 1805 are assigned to the first mask, and the circular node 1814 in the second sub-group 1806 is assigned to the second mask. The first-type conflicted edges 1815 and 1816 arise between the first sub-group 1803 and the second sub-group 1804, and the first sub-group 1805 and the second sub-group 1806, respectively. When the first potential conflicted edge 1817 arises between the second circular node 1810 in the second sub-group 1804 of the first independent group 1801 and one of the circular node (e.g. 1812) in the first sub-group 1805 of the second independent group 1802, and when the second potential conflicted edge 1818 arises between the second circular node 1810 in the second sub-group 1804 of the first independent group 1801 and the other one of the circular node (i.e. 1811 or 1813) in the first sub-group 1805 of the second independent group 1802, then the method continues to operation 2148 to define the second-type conflicted edge 1819 in between the second sub-group 1804 of the first independent group 1801 and the first sub-group 1805 of the second independent group 1802. The second-type conflicted edge 1819 is represented by an arrow-bold line.

In operation 2150, a third type of sub-group pattern is checked. The first-type conflicted edges 902~908 and the potential conflicted edges 1002~1020 obtained in the operation 210 are analyzed to determine if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, and if a third potential conflicted edge arises between the first related layout segment in the first sub-group of the first independent group and a fourth related layout segment in the second sub-group of a third independent group. When the first potential conflicted edge, the second potential conflicted edge, and the third potential conflicted edge are detected, meaning that the third type of sub-group pattern is found, and the method continues to operation 2152 to define one second-type conflicted edge in between the first sub-group of the first independent group and the second sub-group of the third independent group and to discard the first potential conflicted edge, the second potential conflicted edge, and the third potential conflicted edge from the illustration 1000. When the first potential conflicted edge, the second potential conflicted edge, and the third potential conflicted edge are not detected, the method continues to operation 216.

Figure 19:
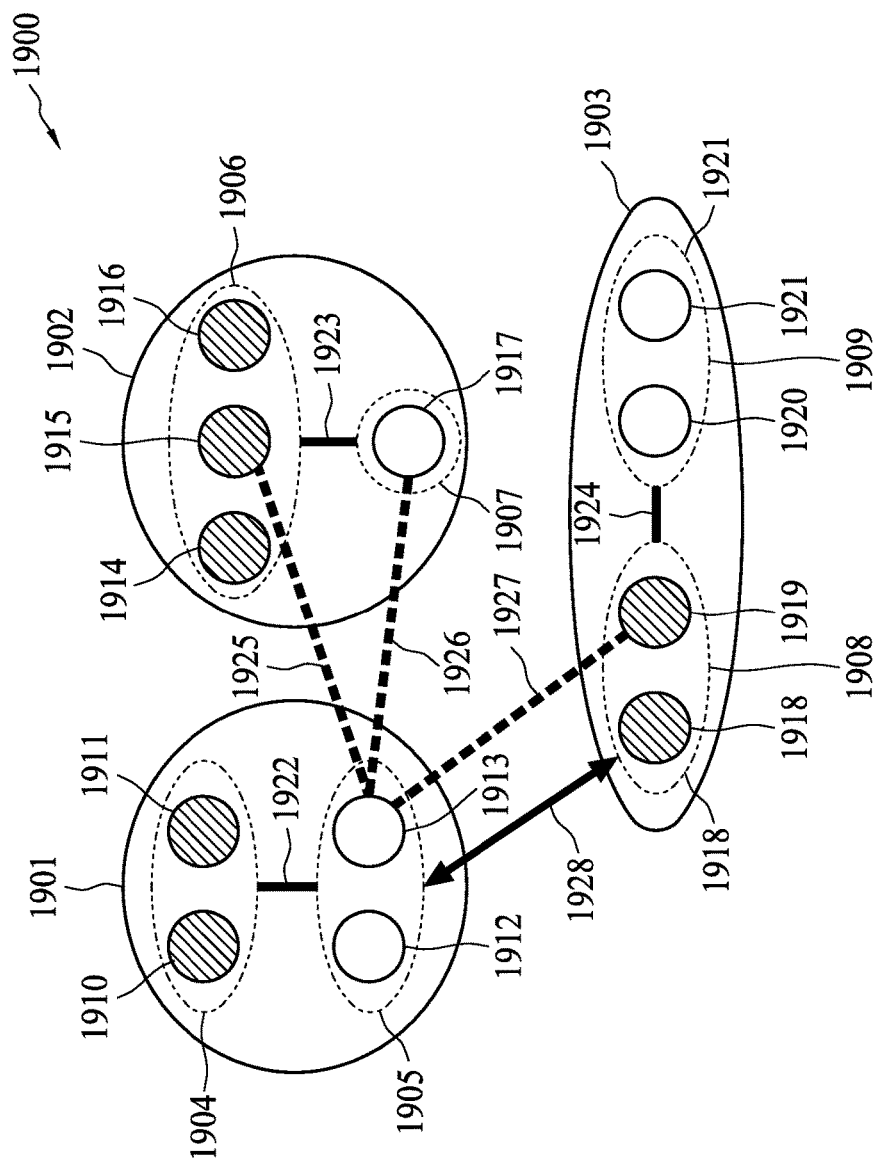
FIG. 19 is a schematic diagram of a simplified pattern being checked in the operation 2150 in FIG. 16 in accordance with some embodiments.

More particularly, the second-type conflicted edge checking pattern in the operation 2150 can be simplified into the pattern as shown in FIG. 19. FIG. 19 is a schematic diagram of a simplified pattern 1900 being checked in the operation 2150 in accordance with some embodiments. For three independent groups 1901, 1903, and 1903, the first independent group 1901 comprises a first sub-group 1904 and a second sub-group 1905, wherein the circular nodes 1910~1911 in the first sub-group 1904 are assigned to the first mask, and the circular nodes 1912~1913 in the second sub-group 1905 are assigned to the second mask. The second independent group 1902 comprises a first sub-group 1906 and a second sub-group 1907, wherein the circular nodes 1914~1916 in the first sub-group 1906 are assigned to the first mask, and the circular node 1917 in the second sub-group 1907 is assigned to the second mask. The third independent group 1903 comprises a first sub-group 1908 and a second sub-group 1909, wherein the circular nodes 1918~1919 in the first sub-group 1908 are assigned to the first mask, and the circular nodes 1920~1921 in the second sub-group 1909 are assigned to the second mask. The first-type conflicted edges 1922, 1923, and 1924 arise between the first sub-group 1904 and the second sub-group 1905, the first sub-group 1906 and the second sub-group 1907, and the first sub-group 1908 and the second sub-group 1909, respectively. When the first potential conflicted edge 1925 arises between the second circular node 1913 in the second sub-group 1905 of the first independent group 1901 and one of the circular node (i.e. 1914, 1915, or 1916) in the first sub-group 1906 of the second independent group 1902, when the second potential conflicted edge 1926 arises between the second circular node 1913 in the second sub-group 1905 of the first independent group 1901 and one of the circular node (i.e. 1917) in the second sub-group 1907 of the second independent group 1902, and when the third potential conflicted edge 1927 arises between the second circular node 1913 in the second sub-group 1905 of the first independent group 1901 and one of the circular node (i.e. 1918 or 1919) in the first sub-group 1908 of the third independent group 1903, then the method continues to operation 2152 to define the second-type conflicted edge 1928 in between the second sub-group 1905 of the first independent group 1901 and the first sub-group 1908 of the third independent group 1903. The second-type conflicted edge 1928 is represented by an arrow-bold line.

Figure 20:
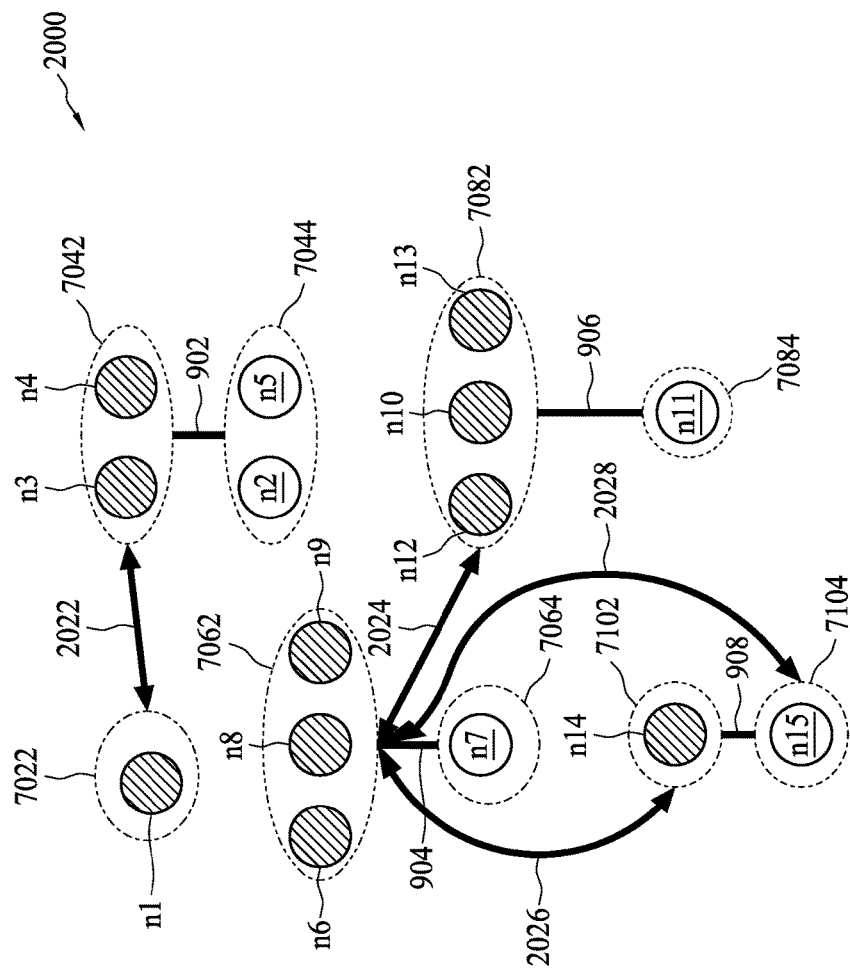
FIG. 20 is a schematic diagram of a simplified illustration of the received layout when the first-type conflicted edges and the second-type conflicted edges are constructed among the plurality of circular nodes in accordance with some embodiments.

In operation 216, the first-type conflicted edge(s) and the second-type conflicted edge(s) are analyzed to check if one or more odd-vertex loops are formed in the plurality of layout segments. For the example of the illustration 1000 in FIG. 10, after the operation 214, a plurality of second-type conflicted edges 2022, 2024, 2026, and 2028 are constructed among the first sub-groups 7022, 7042, 7062, 7082, 7102, and the second sub-groups 7044, 7064, 7084, 7104 as shown in FIG. 20. FIG. 20 is a schematic diagram of a simplified illustration 2000 of the received layout 300 when the first-type conflicted edges 902, 904, 906, and 908, and the second-type conflicted edges 2022, 2024, 2026, and 2028 are constructed among the plurality of circular nodes n1~n15 in accordance with some embodiments. In FIG. 20, it is clear that the second-type conflicted edge 2026, the first-type conflicted edge 908, and the second-type conflicted edge 2028 formed an odd-vertex loop in illustration 2000, wherein the second-type conflicted edge 2026 connects between the first sub-group 7062 and the first sub-group 7102, the first-type conflicted edge 908 connects between the first sub-group 7102 and the second sub-group 7104, and the second-type conflicted edge 2028 connects between the second sub-group 7104 and the first sub-group 7062. The odd-vertex loop formed in the illustration 2000 is a triangle loop. Therefore, when the odd-vertex loop is formed in the illustration 2000, meaning that the layout segments on the odd-vertex loop cannot be photolithographed by two different masks in succession. Therefore, when the odd-vertex loop is found in the illustration 2000, the spacings of the plurality of layout segments S1~S15 may violate the layout design rule of the advanced double patterning photolithography. Then, in operation 218, the first sub-group 7062, the first sub-group 7102, and the second sub-group 7104 that violate the layout design rule may be highlighted in order to warn the designer or manufacturer to revise the placement of those layouts. The designer or manufacturer may adjust the placements of the layout segments of the first sub-group 7062, the first sub-group 7102, and/or the second sub-group 7104 to make the plurality of layout segments S1~S15 passes the advanced double patterning rule check.

Figure 21:
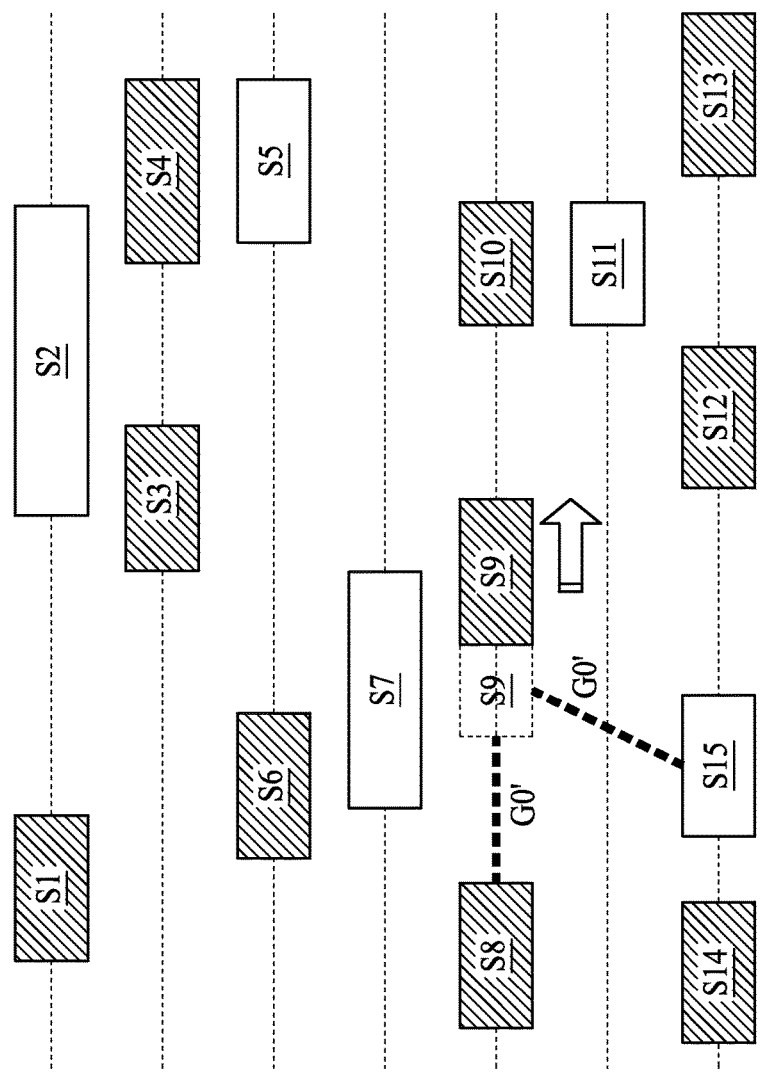
FIG. 21 is a schematic diagram of the received layout after moving the layout segment S9 to the right side on the particular layer of the integrated circuit in accordance with some embodiments.
Figure 22:
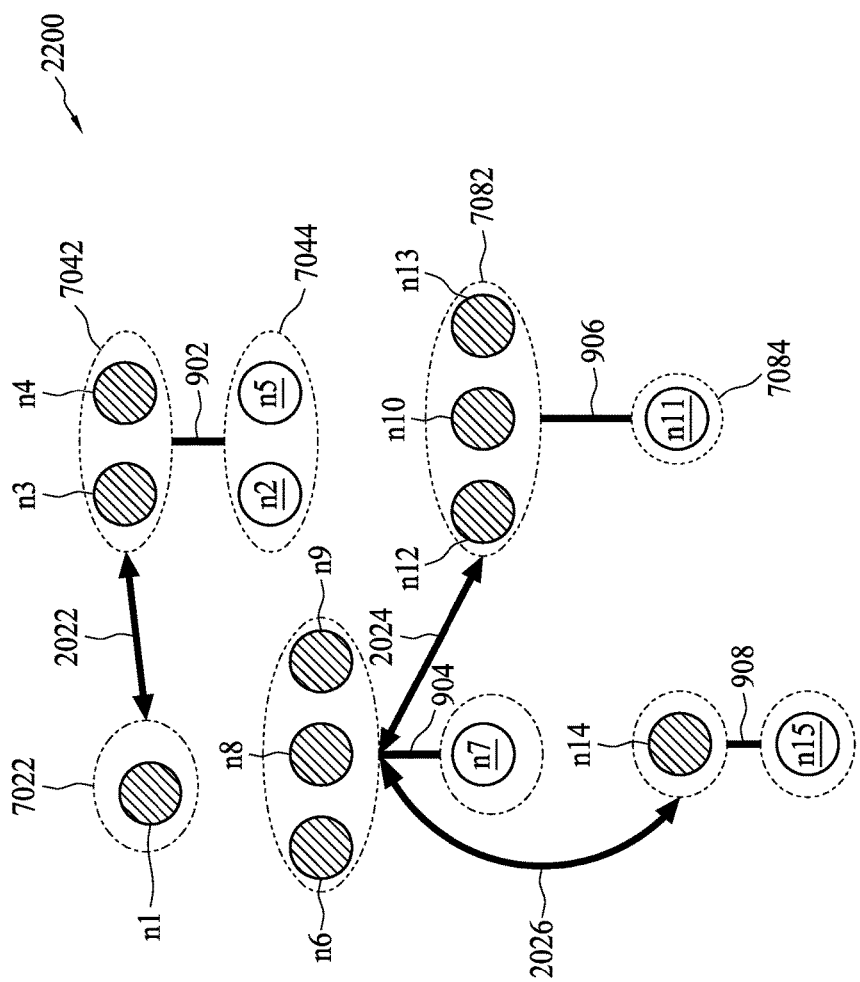
FIG. 22 is a schematic diagram of a simplified illustration of the received layout when the first-type conflicted edges and the second-type conflicted edges are constructed among the plurality of circular nodes in accordance with some embodiments.

For example, the designer or manufacturer may slightly move the layout segment S9 to the right side such that the distance between the layout segment S9 and the layout segment S8 and the distance between the layout segment S9 and the layout segment S15 deviate from the second predetermined length, i.e. the length G0'. FIG. 21 is a schematic diagram of the received layout 300 after moving the layout segment S9 to the right side on the particular layer of the integrated circuit in accordance with some embodiments. When the distance between the layout segment S9 and the layout segment S8 and the distance between the layout segment S9 and the layout segment S15 do not equal the length G0', the second-type conflicted edge 2028 in the illustration 2000 is removed. As a result, the odd-vertex loop in the illustration 2000 is opened as shown in FIG. 22. FIG. 22 is a schematic diagram of a simplified illustration 2200 of the received layout 300 when the first-type conflicted edges 902, 904, 906, and 908, and the second-type conflicted edges 2022, 2024, and 2026 are constructed among the plurality of circular nodes n1~n15 in accordance with some embodiments. No odd-vertex loop is formed in the illustration 2200. In some embodiments, the layout segments S1, S3, S4, S6, S8, S9, S10, S12, S13, S14 are photolithographed by the first mask, and the layout segments S2, S5, S7, S11, S15 are photolithographed by the second mask. It should be noted that, as described in aforementioned paragraph, the mask assignment in FIG. 22 is just an exemplary embodiment. The layout segments S1, S2, S5, S7, S10, S12, S13, S14 may not be all photolithographed by the first mask, and the layout segments S3, S4, S6, S8, S9, S11, S15 may also not be all photolithographed by the second mask. The layout segments S1, S2, S3, S4, S5, S6, S7, S8, S9, S10, S11, S12, S13, S14, S15 may be assigned to the first mask and the second mask in different combinations as long as the layout segments in the two sub-groups of an independent group are not assigned to the same mask. For example, in another embodiment, the layout segments that are assigned to the first mask may be S1, S2, S5, S7, S10, S12, S13, S14, and the layout segments that are assigned to the second mask may be S3, S4, S6, S8, S9, S11, S15.

Figure 23:
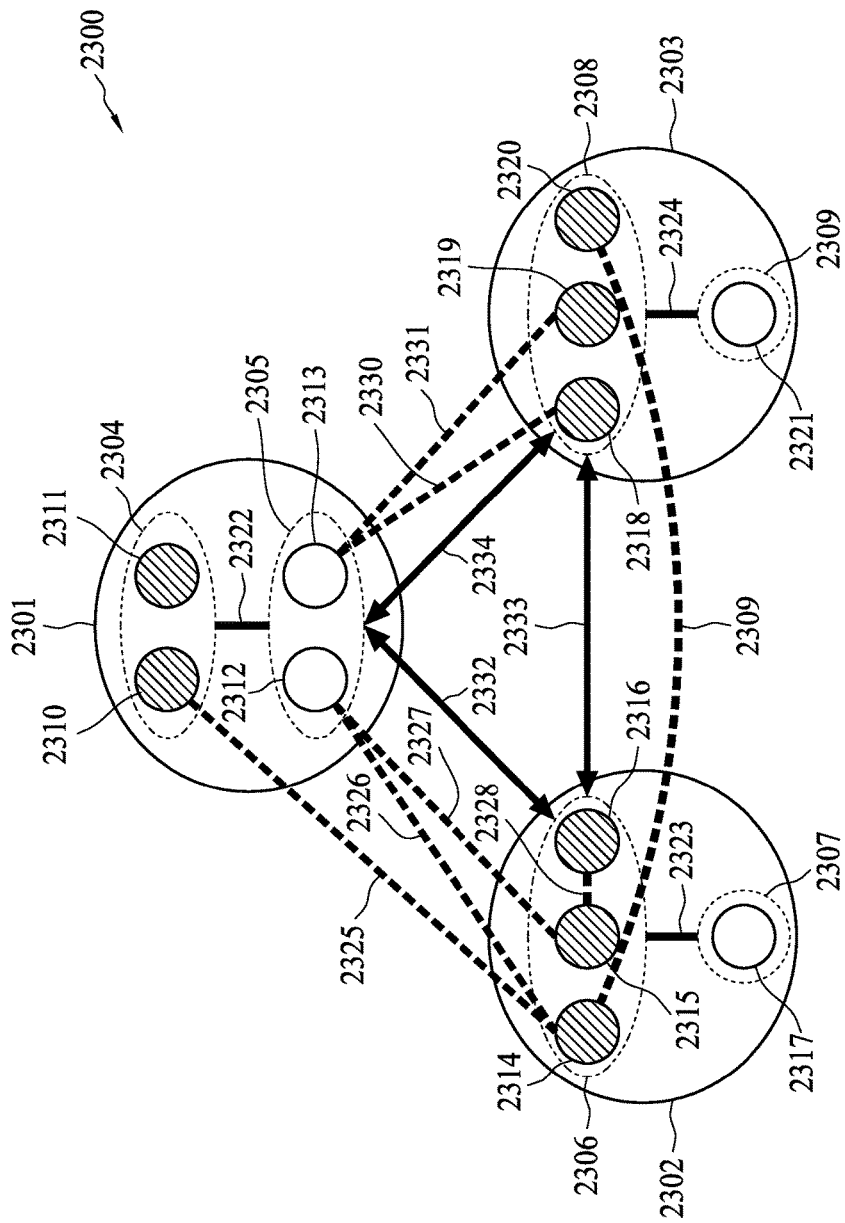
FIG. 23 is a schematic diagram of a simplified illustration having an odd-vertex loop merely formed by the second-type conflicted edges in accordance with some embodiments.

In operation 216, the odd-vertex loop may be merely formed by the second-type conflicted edges. For the example as shown in FIG. 23, which is a schematic diagram of a simplified illustration 2300 having an odd-vertex loop merely formed by the second-type conflicted edges in accordance with some embodiments, the illustration 2300 comprises, for example, three independent groups 2301, 2302, and 2303. The first independent group 2301 comprises a first sub-group 2304 and a second sub-group 2305, wherein the circular nodes 2310~2311 in the first sub-group 2304 are assigned to the first mask, and the circular nodes 2312~2313 in the second sub-group 2305 are assigned to the second mask. The second independent group 2302 comprises a first sub-group 2306 and a second sub-group 2307, wherein the circular nodes 2314~2316 in the first sub-group 2306 are assigned to the first mask, and the circular node 2317 in the second sub-group 2307 is assigned to the second mask. The third independent group 2303 comprises a first sub-group 2308 and a second sub-group 2309, wherein the circular nodes 2318~2320 in the first sub-group 2308 are assigned to the first mask, and the circular node 2309 in the second sub-group 2321 is assigned to the second mask. The first-type conflicted edges 2322, 2323, and 2324 arise between the first sub-group 2304 and the second sub-group 2305, the first sub-group 2306 and the second sub-group 2307, and the first sub-group 2308 and the second sub-group 2309 respectively. After the operation 210, for example, the potential conflicted edge 2325 arises between the circular node 2310 in the first sub-group 2304 of the first independent group 2301 and the circular node 2314 in the first sub-group 2306 of the second independent group 2302, the potential conflicted edge 2326 arises between the circular node 2312 in the second sub-group 2305 of the first independent group 2301 and the circular node 2314 in the first sub-group 2306 of the second independent group 2302, the potential conflicted edge 2327 arises between the circular node 2312 in the second sub-group 2305 of the first independent group 2301 and the circular node 2315 in the first sub-group 2306 of the second independent group 2302, the potential conflicted edge 2328 arises between the circular nodes 2315 and 2316 in the first sub-group 2306 of the second independent group 2302, the potential conflicted edge 2329 arises between the circular node 2314 in the first sub-group 2306 of the second independent group 2302 and the circular node 2320 in the first sub-group 2308 of the third independent group 2303, the potential conflicted edge 2330 arises between the circular node 2313 in the second sub-group 2305 of the first independent group 2301 and the circular node 2318 in the first sub-group 2308 of the third independent group 2303, and the potential conflicted edge 2331 arises between the circular node 2313 in the second sub-group 2305 of the first independent group 2301 and the circular node 2319 in the first sub-group 2308 of the third independent group 2303. Then, in operation 214, the second-type conflicted edges 2332, 2333, and 2334 are formed, wherein the second-type conflicted edge 2332 arises between the second sub-group 2305 and the first sub-group 2306, the second-type conflicted edge 2333 arises between the first sub-group 2306 and the first sub-group 2308, and the second-type conflicted edge 2334 arises between the second sub-group 2305 and the first sub-group 2308. Then, the odd-vertex loop comprised merely the second-type conflicted edges (i.e. 2332~2334) is formed. In other words, even the odd-vertex loop is merely formed by the second-type conflicted edges, a design rule violation occurs and the corresponding layout segments or circular nodes (e.g. the circular nodes in the second sub-group 2305, the first sub-group 2306, and the first sub-group 2308) are highlighted.

In operation 220, when no odd-vertex loop is formed by the connection of the first-type conflicted edges and the second-type conflicted edges, then the plurality of layout segments S1~S15 passes the advanced double patterning rule check, and the plurality of layout segments S1~S15 may be photolithographed by the advanced double patterning technology.

Briefly, the layout checking method 200 not only checks the spacing between the two adjacent shapes in the layout segments of a layer but also checks the consecutive spacing between three or more adjacent shapes in the layout segments to determine if the placement of the layout segments violates the double pattern rule. As the layout checking method 200 identifies the coloring conditions between the two sub-groups in the independent groups and performs the coloring process from bottom to top level, the layout checking method 200 resolves the overkill issue or the larger number of false alarms caused by the conventional checking method. Therefore, by using the layout checking method 200 to check the layout placement of an integrated circuit, the designer or manufacturer may save the time to fix for the false alarmed pattern caused by the conventional checking method.

Figure 24:
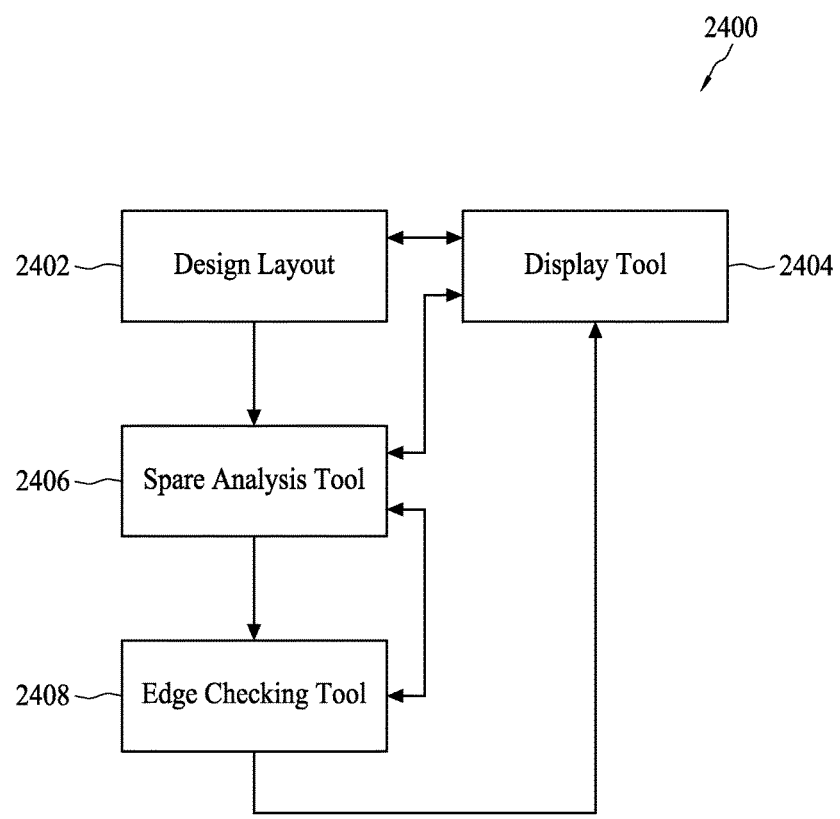
FIG. 24 is a functional block diagram of a layout checking software system in accordance with some embodiments.

FIG. 24 is a functional block diagram of a layout checking software system 2400 in accordance with some embodiments. In some embodiments, the layout checking software system 2400 includes a space analysis tool 2406 and an edge checking tool 2408. The space analysis tool 2406 receives a design layout 2402 of an integrated circuit. The display tool 2404 is configured to display the plurality of layout segments in the layer of the integrated circuit. The space analysis tool 2406 is configured to perform the operation 206 is FIG. 2 to replace the plurality of layout segments with a plurality of circuit nodes respectively. The space analysis tool 2406 is further configured to perform the operation 2082 in FIG. 5 to determine the third-type conflicted edges 601~610 among the plurality of layout segments S1~S15 according to the length G0. The space analysis tool 2406 is further configured to perform the operation 2086 in FIG. 5 to group the plurality of circular nodes n1~n15 into the plurality of independent groups 702~710. The space analysis tool 2406 is further configured to perform the operation 2088 in FIG. 5 to group the one or more circular nodes in each independent group of the plurality of independent groups 702~708 into two sub-groups. The space analysis tool 2406 is further configured to perform the operation 2090 in FIG. 5 to assign the first sub-groups 7022, 7042, 7062, 7082, 7102, and the second sub-groups 7024, 7044, 7064, 7084, 7104 with different colors, i.e. the first color and the second color. The space analysis tool 2406 is further configured to perform the operation 2092 in FIG. 5 to replace the solid line(s) connecting the first sub-group and the second sub-group of each independent group with one bold solid line. The space analysis tool 2406 is further configured to perform the operation 210 in FIG. 2 to determine the potential conflicted edges 1002~1020 according to the second predetermined length, i.e. the length G0'. The edge checking tool 2408 is configured to perform the operation 2084 in FIG. 5 to checked if one or more odd-vertex loops are formed by the third-type conflicted edges 601~610. The edge checking tool 2408 is further configured to perform the operation 212 in FIG. 2 to determine if a violation occurs in the plurality of layout segments S1~S15 in the up-front checking process. The edge checking tool 2408 is further configured to perform the operation 214 in FIG. 2 to determine the second-type conflicted edges 1022, 1024, 1026, and 1028. The edge checking tool 2408 is further configured to perform the operation 216 in FIG. 2 to determine if one or more odd-vertex loops are formed in the plurality of layout segments S1~S15. The display tool 2404 is further configured to display the highlighted circular nodes or the corresponding layout segments that violate the layout design rule.

Figure 25:
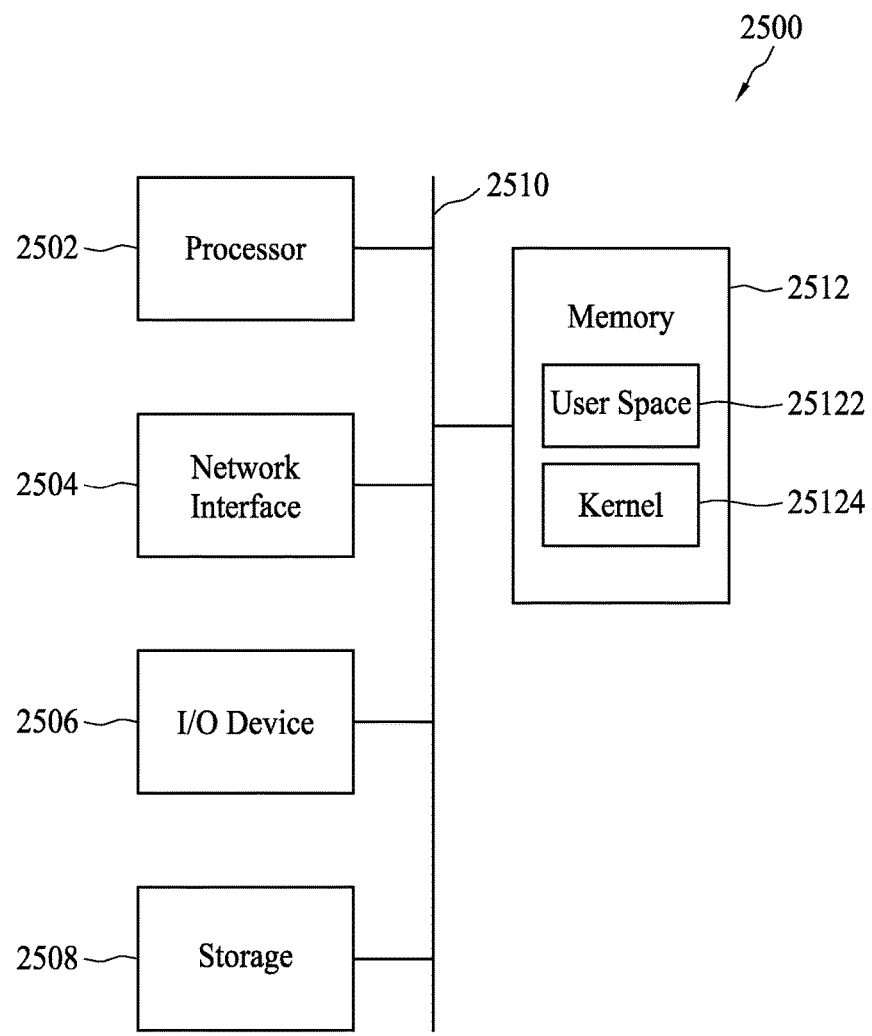
FIG. 25 is a block diagram of a hardware system for implementing the layout checking method described with reference to FIG. 2 and the layout checking software system described with references to FIG. 24 in accordance with some embodiments.

FIG. 25 is a block diagram of a hardware system 2500 for implementing the layout checking method described with reference to FIG. 2 and the layout checking software system 2400 described with references to FIG. 24 in accordance with some embodiments. The system 2500 includes at least one processor 2502, a network interface 2504, an input and output (I/O) device 2506, a storage 2508, a memory 2512, and a bus 2510. The bus 2510 couples the network interface 2504, the I/O device 2506, the storage 2508 and the memory 2512 to the processor 2502.

In some embodiments, the memory 2512 comprises a random access memory (RAM) and/or other volatile storage device and/or read only memory (ROM) and/or other non-volatile storage device. The memory 2512 includes a kernel 2516 and user space 2514, configured to store program instructions to be executed by the processor 2502 and data accessed by the program instructions.

In some embodiments, the network interface 2504 is configured to access program instructions and data accessed by the program instructions stored remotely through a network. The I/O device 2506 includes an input device and an output device configured for enabling user interaction with the system 2500. The input device comprises, for example, a keyboard, a mouse, etc. The output device comprises, for example, a display, a printer, etc. The storage device 2508 is configured for storing program instructions and data accessed by the program instructions. The storage device 2508 comprises, for example, a magnetic disk and an optical disk.

In some embodiments, when executing the program instructions, the processor 2502 is configured to as method embodiments described with reference to FIG. 2 and software system embodiments described with references to FIG. 24.

In some embodiments, the program instructions are stored in a non-transitory computer readable recording medium such as one or more optical disks, hard disks and non-volatile memory devices.

In some embodiments, in a layout checking method performed by at least one processor, spaces among a plurality of layout segments of an integrated circuit is analyzed to determine at least one first-type conflicted edge according to a first predetermined length. The spaces among the plurality of layout segments of the integrated circuit is analyzed by the at least one processor to determine a plurality of potential conflicted edges according to a second predetermined length different from the first predetermined length. At least one second-type conflicted edge is determined by the at least one processor according to the plurality of potential conflicted edges. If at least one odd-vertex loop is formed in the plurality of layout segments is checked by the at least one processor according to the at least one first-type conflicted edge and the at least one second-type conflicted edge to determine if a violation occurs in the plurality of layout segments.

In some embodiments, a system comprises at least one processor and at least one memory. The at least one processor is configured to execute program instructions which configure the at least one processor as a space analysis tool and an edge checking tool. The space analysis tool is configured to analyze spaces among a plurality of layout segments of an integrated circuit to determine at least one first-type conflicted edge according to a first predetermined length. The space analysis tool is configured to analyze spaces among the plurality of layout segments of the integrated circuit to determine a plurality of potential conflicted edges according to a second predetermined length different from the first predetermined length. The edge checking tool is configured to determine at least one second-type conflicted edge according to the plurality of potential conflicted edges. The edge checking tool is configured to check if at least one odd-vertex loop is formed in the plurality of layout segments according to the at least one first-type conflicted edge and the at least one second-type conflicted edge to determine if a violation occurs in the plurality of layout segments. The at least one memory is configured to store the program instructions.

In some embodiments, a non-transitory computer-readable storage medium storing program instructions that when executed by a computer cause the computer to perform a layout checking method. In the layout checking method, spaces among a plurality of layout segments of an integrated circuit is analyzed by the at least one processor to determine at least one first-type conflicted edge according to a first predetermined length. The spaces among the plurality of layout segments of the integrated circuit is analyzed by the at least one processor to determine a plurality of potential conflicted edges according to a second predetermined length different from the first predetermined length. At least one second-type conflicted edge is determined by the at least one processor according to the plurality of potential conflicted edges. If at least one odd-vertex loop is formed in the plurality of layout segments is checked by the at least one processor according to the at least one first-type conflicted edge and the at least one second-type conflicted edge to determine if a violation occurs in the plurality of layout segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout checking method performed by at least one processor, comprising:
   analyzing, by the at least one processor, spaces among a plurality of layout segments of an integrated circuit to determine at least one first-type conflicted edge according to a first predetermined length;
   analyzing, by the at least one processor, spaces among the plurality of layout segments of the integrated circuit to determine a plurality of potential conflicted edges according to a second predetermined length different from the first predetermined length;
   determining, by the at least one processor, at least one second-type conflicted edge according to the plurality of potential conflicted edges;
   checking, by the at least one processor, if at least one odd-vertex loop is formed in the plurality of layout segments according to the at least one first-type conflicted edge and the at least one second-type conflicted edge to determine if a violation occurs in the plurality of layout segments;

wherein analyzing spaces among the plurality of layout segments of the integrated circuit to determine the at least one first-type conflicted edge according to the first predetermined length comprises:
- analyzing spaces among the plurality of layout segments of the integrated circuit to determine a plurality of third-type conflicted edges according to the first predetermined length;
- grouping the plurality of layout segments into a plurality of independent groups according to the plurality of third-type conflicted edges;
- grouping each independent group in the plurality of independent groups into a first sub-group and a second sub-group; and
- for the first sub-group and the second sub-group in each independent group in the plurality of independent groups, defining one first-type conflicted edge in between the first sub-group and the second sub-group; and causing the first sub-group and the second sub-group to be fabricated by a first mask and a second mask, respectively, wherein the first mask is different from the second mask;

wherein no third-type conflicted edge exists in the first sub-group and the second sub-group, no third-type conflicted edge exists between two independent groups in the plurality of independent groups, and, for at least one independent group in the plurality of independent groups, the at least one independent group comprises a plurality of related layout segments where each related layout segment forms a third type conflicted edge with at least one adjacent related layout segment in the plurality of related layout segments.

2. The layout checking method of claim 1, wherein determining the at least one second-type conflicted edge according to the plurality of potential conflicted edges comprises:
- determining if a first potential conflicted edge arises between a first related layout segment and a second related layout segment in the first sub-group of a first independent group, and if a second potential conflicted edge arises between the second related layout segment in the first sub-group of the first independent group and a third critical layout segment in the second sub-group of a second independent group; and
- when the first potential conflicted edge and the second potential conflicted edge arise, defining one second-type conflicted edge in between the first sub-group of the first independent group and the second sub-group of the second independent group.

3. The layout checking method of claim 1, wherein determining the at least one second-type conflicted edge according to the plurality of potential conflicted edges comprises:
- determining if a first potential conflicted edge arises between a first related layout segment in the first sub-group of a first independent group and a second related layout segment in the second sub-group of a second independent group, and if a second potential conflicted edge arises between the first related layout segment in the first sub-group of the first independent group and a third related layout segment in the second sub-group of the second independent group; and
- when the first potential conflicted edge and the second potential conflicted edge arise, defining one second-type conflicted edge in between the first sub-group of the first independent group and the second sub-group of the second independent group.

4. The layout checking method of claim 1, wherein determining the at least one second-type conflicted edge according to the plurality of potential conflicted edges comprises:
- determining if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, and if a third potential conflicted edge arises between the first related layout segment in the first sub-group of the first independent group and a fourth related layout segment in the second sub-group of a third independent group; and
- when the first potential conflicted edge, the second potential conflicted edge, and the third potential conflicted edge arise, defining one second-type conflicted edge in between the first sub-group of the first independent group and the second sub-group of the third independent group.

5. The layout checking method of claim 1, further comprising:
- determining, by the at least one processor, if a first potential conflicted edge arises between a first related layout segment and a second related layout segment in the first sub-group of a first independent group and if a second potential conflicted edge arises between the second related layout segment and a third related layout segment in the first sub-group of a first independent group; and
- when the first potential conflicted edge and the second potential conflicted edge arise, determining the violation occurs in the plurality of layout segments.

6. The layout checking method of claim 1, further comprising:
- determining, by the at least one processor, if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, if a third potential conflicted edge arises between the first related layout segment in the first sub-group of the first independent group and a fourth related layout segment in the first sub-group of a third independent group, and if a fourth potential conflicted edge arises between the first related layout segment in the first sub-group of the first independent group and a fifth related layout segment in the second sub-group of the third independent group; and
- when the first potential conflicted edge, the second potential conflicted edge, the third potential conflicted edge, and the fourth potential conflicted edge arise, determining the violation occurs in the plurality of layout segments.

7. The layout checking method of claim 1, further comprising:

determining, by the at least one processor, if a first potential conflicted edge arises between a first related layout segment and a second related layout segment in the first sub-group of a first independent group, if a second potential conflicted edge arises between the second related layout segment in the first sub-group of the first independent group and a third related layout segment in the first sub-group of a second independent group, and if a third potential conflicted edge arises between the second related layout segment in the first sub-group of the first independent group and a fourth related layout segment in the second sub-group of the second independent group; and when the first potential conflicted edge, the second potential conflicted edge, and the third potential conflicted edge arise, determining the violation occurs in the plurality of layout segments.

8. The layout checking method of claim 1, further comprising:

determining, by the at least one processor, if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a second related layout segment in the first sub-group of the second independent group, if a third potential conflicted edge arises between the first related layout segment in the first sub-group of the first independent group and a fourth related layout segment in the second sub-group of the second independent group, and if a fourth potential conflicted edge arises between the first related layout segment in the first sub-group of the first independent group and a fifth related layout segment in the second sub-group of the second independent group; and when the first potential conflicted edge, the second potential conflicted edge, the third potential conflicted edge, and the fourth potential conflicted edge arise, determining the violation occurs in the plurality of layout segments.

9. A system, comprising:

at least one processor, configured to execute program instructions which configure the at least one processor as a space analysis tool and an edge checking tool that perform operations comprising:

analyzing, by the space analysis tool, spaces among a plurality of layout segments of an integrated circuit to determine at least one first-type conflicted edge according to a first predetermined length;

analyzing, by the space analysis tool, spaces among the plurality of layout segments of the integrated circuit to determine a plurality of potential conflicted edges according to a second predetermined length different from the first predetermined length;

determining, by the edge checking tool, at least one second-type conflicted edge according to the plurality of potential conflicted edges;

checking, by the edge checking tool, if at least one odd-vertex loop is formed in the plurality of layout segments according to the at least one first-type conflicted edge and the at least one second-type conflicted edge to determine if a violation occurs in the plurality of layout segments;

wherein the space analysis tool analyzes spaces among the plurality of layout segments of the integrated circuit to determine the at least one first-type conflicted edge according to the first predetermined length by performing operations comprises:

analyzing spaces among the plurality of layout segments of the integrated circuit to determine a plurality of third-type conflicted edges according to the first predetermined length;

grouping the plurality of layout segments into a plurality of independent groups according to the plurality of third-type conflicted edges;

grouping each independent group in the plurality of independent groups into a first sub-group and a second sub-group; and for the first sub-group and the second sub-group in each independent group in the plurality of independent groups, defining one first-type conflicted edge in between the first sub-group and the second sub-group;

causing the first sub-group and the second sub-group to be fabricated by a first mask and a second mask, respectively, wherein the first mask is different from the second mask; and at least one memory configured to store the program instructions;

wherein no third-type conflicted edge exists in the first sub-group and the second sub-group, no third-type conflicted edge exists between two independent groups in the plurality of independent groups, and, for at least one independent group in the plurality of independent groups, the at least one independent group comprises a plurality of related layout segments where each related layout segment forms a third-type conflicted edge with at least one adjacent related layout segment in the plurality of related layout segments.

10. The system of claim 9, wherein the edge checking tool determines the at least one second-type conflicted edge according to the plurality of potential conflicted edges by performing operations comprising:

determining if a first potential conflicted edge arises between a first related layout segment and a second related layout segment in the first sub-group of a first independent group, and if a second potential conflicted edge arises between the second related layout segment in the first sub-group of the first independent group and a third critical layout segment in the second sub-group of a second independent group; and when the first potential conflicted edge and the second potential conflicted edge arise, defining one second-type conflicted edge in between the first sub-group of the first independent group and the second sub-group of the second independent group.

11. The system of claim 9, wherein the edge checking tool determines the at least one second-type conflicted edge according to the plurality of potential conflicted edges by performing operations comprising:

determining if a first potential conflicted edge arises between a first related layout segment in the first sub-group of a first independent group and a second related layout segment in the second sub-group of a second independent group, and if a second potential conflicted edge arises between the first related layout segment in the first sub-group of the first independent group and a third related layout segment in the second sub-group of the second independent group; and when the first potential conflicted edge and the second potential conflicted edge arise, defining one second-type conflicted edge in between the first sub-group of the first independent group and the second sub-group of the second independent group.

12. The system of claim 9, wherein the edge checking tool determines the at least one second-type conflicted edge according to the plurality of potential conflicted edges by performing operations comprising:
determining if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, and if a third potential conflicted edge arises between the first related layout segment in the first sub-group of the first independent group and a fourth related layout segment in the second sub-group of a third independent group; and
when the first potential conflicted edge, the second potential conflicted edge, and the third potential conflicted edge arise, defining one second-type conflicted edge in between the first sub-group of the first independent group and the second sub-group of the third independent group.

13. The system of claim 9, wherein the edge checking tool further performs operations comprising:
determining if a first potential conflicted edge arises between a first related layout segment and a second related layout segment in the first sub-group of a first independent group and if a second potential conflicted edge arises between the second related layout segment and a third related layout segment in the first sub-group of a first independent group; and
when the first potential conflicted edge and the second potential conflicted edge arise, determining the violation occurs in the plurality of layout segments.

14. The system of claim 9, wherein the edge checking tool further performs operations comprising:
determining if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a third related layout segment in the first sub-group of the second independent group, if a third potential conflicted edge arises between the first related layout segment in the first sub-group of the first independent group and a fourth related layout segment in the first sub-group of a third independent group, and if a fourth potential conflicted edge arises between the first related layout segment in the first sub-group of the first independent group and a fifth related layout segment in the second sub-group of the third independent group; and
when the first potential conflicted edge, the second potential conflicted edge, the third potential conflicted edge, and the fourth potential conflicted edge arise, determining the violation occurs in the plurality of layout segments.

15. The system of claim 9, wherein the edge checking tool further performs operations comprising:
determining if a first potential conflicted edge arises between a first related layout segment and a second related layout segment in the first sub-group of a first independent group, if a second potential conflicted edge arises between the second related layout segment in the first sub-group of the first independent group and a third related layout segment in the first sub-group of a second independent group, and if a third potential conflicted edge arises between the second related layout segment in the first sub-group of the first independent group and a fourth related layout segment in the second sub-group of the second independent group; and
when the first potential conflicted edge, the second potential conflicted edge, and the third potential conflicted edge arise, determining the violation occurs in the plurality of layout segments.

16. The system of claim 9, wherein the edge checking tool further performs operations comprising:
determining if a first potential conflicted edge arises between a first related layout segment in the first sub-group of a first independent group and a second related layout segment in the second sub-group of a second independent group, if a second potential conflicted edge arises between the first related layout segment in the first sub-group of the first independent group and a second related layout segment in the first sub-group of the second independent group, if a third potential conflicted edge arises between the first related layout segment in the first sub-group of the first independent group and a fourth related layout segment in the second sub-group of the second independent group, and if a fourth potential conflicted edge arises between the first related layout segment in the first sub-group of the first independent group and a fifth related layout segment in the second sub-group of the second independent group; and
when the first potential conflicted edge, the second potential conflicted edge, the third potential conflicted edge, and the fourth potential conflicted edge arise, determining the violation occurs in the plurality of layout segments.

17. A non-transitory computer-readable storage medium storing program instructions that when executed by a computer cause the computer to perform a layout checking method, the layout checking method comprising:
analyzing, by the at least one processor, spaces among a plurality of layout segments of an integrated circuit to determine at least one first-type conflicted edge according to a first predetermined length;
analyzing, by the at least one processor, spaces among the plurality of layout segments of the integrated circuit to determine a plurality of potential conflicted edges according to a second predetermined length different from the first predetermined length;
determining, by the at least one processor, at least one second-type conflicted edge according to the plurality of potential conflicted edges;
checking, by the at least one processor, if at least one odd-vertex loop is formed in the plurality of layout segments according to the at least one first-type conflicted edge and the at least one second-type conflicted edge to determine if a violation occurs in the plurality of layout segments;
wherein analyzing spaces among the plurality of layout segments of the integrated circuit to determine the at least one first-type conflicted edge according to the first predetermined length comprises:
analyzing spaces among the plurality of layout segments of the integrated circuit to determine a plurality of third-type conflicted edges according to the first predetermined length;

grouping the plurality of layout segments into a plurality of independent groups according to the plurality of third-type conflicted edges;

grouping each independent group in the plurality of independent groups into a first sub-group and a second sub-group; and for the first sub-group and the second sub-group in each independent group in the plurality of independent groups, defining one first-type conflicted edge in between the first sub-group and the second sub-group; and causing the first sub-group and the second sub-group to be fabricated by a first mask and a second mask, respectively, wherein the first mask is different from the second mask;

wherein no third-type conflicted edge exists in the first sub-group and the second sub-group, no third-type conflicted edge exists between two independent groups in the plurality of independent groups, and, for at least one independent group in the plurality of independent groups, the at least one independent group comprises a plurality of related layout segments where each related layout segment forms a third-type conflicted edge with at least one adjacent related layout segment in the plurality of related layout segments.

* * * * *